(12) United States Patent
Robinett et al.

(10) Patent No.: US 7,319,416 B2
(45) Date of Patent: Jan. 15, 2008

(54) TUNNELING-RESISTOR-JUNCTION-BASED MICROSCALE/NANOSCALE DEMULTIPLEXER ARRAYS

(75) Inventors: Warren Robinett, Chapel Hill, NC (US); Gregory S. Snider, Mountain View, CA (US); Duncan Stewart, Menlo Park, CA (US); Joseph Straznicky, Santa Rosa, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 177 days.

(21) Appl. No.: 11/343,325

(22) Filed: Jan. 30, 2006

(65) Prior Publication Data
US 2007/0176801 A1 Aug. 2, 2007

(51) Int. Cl.
*H03M 7/14* (2006.01)

(52) U.S. Cl. .......................... 341/96; 341/50

(58) Field of Classification Search ............ 341/50–96
See application file for complete search history.

(56) References Cited

U.S. PATENT DOCUMENTS 6,570,795 B1* 5/2003 Fricke et al. ............... 365/200
2005/0193356 A1* 9/2005 Kuekes et al. ............... 716/12

* cited by examiner

Primary Examiner—Lam T. Mai

(57) ABSTRACT

Various embodiments of the present invention are directed to demultiplexers that include tunneling resistor nanowire junctions, and to nanowire addressing methods for reliably addressing nanowire signal lines in nanoscale and mixed-scale demultiplexers. In one embodiment of the present invention, an encoder-demultiplexer comprises a number of input signal lines and an encoder that generates an n-bit-constant-weight-code code-word internal address for each different input address received on the input signal lines. The encoder-demultiplexer includes n microscale signal lines on which an n-bit-constant-weight-code code-word internal address is output by the encoder, where each microscale signal line carries one bit of the n-bit-constant-weight-code code-word internal address. The encoder-demultiplexer also includes a number of encoder-demultiplexer-addressed nanowire signal lines interconnected with the n microscale signal lines via tunneling resistor junctions, the encoder-demultiplexer-addressed nanowire signal lines each associated with an n-bit-constant-weight-code code-word internal address.

12 Claims, 19 Drawing Sheets

|  $n$  |  $q$  |
|---|---|
| 0,1,1,0,0,0,0,0,1,0,0,0,1,1,1,0 | 0,0,0,0,0,0,0,0 |
| 0,1,0,1,0,0,0,0,1,1,0,0,0,1,1,0 | 0,0,0,0,0,0,0,1 |
| 1,1,0,0,0,0,1,1,0,0,1,0,0,0,1,0 | 0,0,0,0,0,0,1,1 |
| 1,0,1,0,0,1,0,0,1,1,0,1,0,0,0,0 | 0,0,0,0,0,1,0,0 |
| $u_4$ | $a_4$ |
| $u_5$ | $a_5$ |
| $u_6$ | $a_6$ |
| $u_7$ | $a_7$ |
| $u_8$ | $a_8$ |
| $u_9$ | $a_9$ |
| $u_{10}$ | $a_{10}$ |
| $u_{11}$ | $a_{11}$ |
| $u_{12}$ | $a_{12}$ |
| $u_{13}$ | $a_{13}$ |
| $u_{14}$ | $a_{14}$ |
| $u_{15}$ | $a_{15}$ |
| $u_{m-14}$ | $a_{m-14}$ |
| $u_{m-13}$ | $a_{m-13}$ |
| $u_{m-12}$ | $a_{m-12}$ |
| $u_{m-11}$ | $a_{m-11}$ |
| $u_{m-10}$ | $a_{m-10}$ |
| $u_{m-9}$ | $a_{m-9}$ |
| $u_{m-8}$ | $a_{m-8}$ |
| $u_{m-7}$ | $a_{m-7}$ |
| $u_{m-6}$ | $a_{m-6}$ |
| $u_{m-5}$ | $a_{m-5}$ |
| $u_{m-4}$ | $a_{m-4}$ |
| $u_{m-3}$ | $a_{m-3}$ |
| $u_{m-2}$ | $a_{m-2}$ |
| $u_{m-1}$ | $a_{m-1}$ |

$$w(v) = \sum_{i=0}^{n-1} v_i$$

$$w(v_f) = w(\boxed{0\,1\,1\,0\,1\,0\,0\,0\,1\,0\,1\,1}) = 6$$
$$\phantom{w(v_f) = w(}v_f$$

$$w(v_f) = d_{v_f - v_0} = v_f \oplus v_0 = 6$$

1102 (array), 1104

TUNNELING-RESISTOR-JUNCTION-BASED MICROSCALE/NANOSCALE DEMULTIPLEXER ARRAYS

TECHNICAL FIELD

The present invention is related to mixed microscale/nanoscale electronics, and, in particular, to tunneling-resistor-logic-based microscale/nanoscale demultiplexer arrays and methods for addressing tunneling-resistor-logic-based microscale/nanoscale demultiplexer arrays.

BACKGROUND OF THE INVENTION

During the past fifty years, the electronics and computing industries have been relentlessly propelled forward by ever decreasing sizes of basic electronic components, such as transistors and signal wires, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light (i.e., about 193 nm), for example, far more technically demanding technologies may need to be employed to create smaller components using photolithographic techniques. Expensive semiconductor fabrication facilities may need to be rebuilt in order to use the new technologies. Many new obstacles may be encountered. For example, it is necessary to fabricate semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating submicroscale and nanoscale electronic devices using alternative technologies. Nanoscale electronic devices generally employ nanoscale signal wires having widths, and nanoscale components having dimensions, of less than 100 nanometers. More densely fabricated nanoscale electronic devices may employ nanoscale signal wires having widths, and nanoscale components having dimensions, of less than 50 nanometers, or, in certain types of devices, less than 10 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. For example, mixed microscale/nanoscale encoder-demultiplexers are employed to access demultiplexer nanowires through selective interconnections that are fabricated at microscale signal line and nanowire intersections. An encoder accesses a particular nanowire by outputting a pattern of voltages that matches the pattern of selective interconnections of the nanowire. The pattern of voltages is input to the demultiplexer via the microscale signal lines. However, certain electrical components, such as diodes, comprising the interconnections are not typically reliable at nanoscale dimensions. As a result, designers, manufacturers, and users of demultiplexers continue to seek reliable nanoscale electronic components that can be used to fabricate demultiplexers at the nanoscale and methods for assessing the performance of demultiplexers implemented with the nanoscale electronic components.

SUMMARY OF THE INVENTION

Various embodiments of the present invention are directed to demultiplexers that include tunneling resistor nanowire junctions, and to nanowire addressing methods for reliably addressing nanowire signal lines in nanoscale and mixed-scale demultiplexers. In one embodiment of the present invention, an encoder-demultiplexer comprises a number of input signal lines and an encoder that generates an n-bit-constant-weight-code code-word internal address for each different input address received on the input signal lines. The encoder-demultiplexer includes n microscale signal lines on which an n-bit-constant-weight-code code-word internal address is output by the encoder, where each microscale signal line carries one bit of the n-bit-constant-weight-code code-word internal address. The encoder-demultiplexer also includes a number of encoder-demultiplexer-addressed nanowire signal lines interconnected with the n microscale signal lines via tunneling resistor junctions, the encoder-demultiplexer-addressed nanowire signal lines each associated with an n-bit-constant-weight-code code-word internal address.

BRIEF DESCRIPTION OF THE DRAWINGS

FIG. 7 shows a table representing a constant-weight error-control-encoding code.

FIG. 8 illustrates computation of the distance between two code words, $u_a$ and $u_b$, of a binary code, such as a constant-weight code.

FIG. 11 illustrates determination of the weight of a code word.

DETAILED DESCRIPTION OF THE INVENTION

Figure 1:
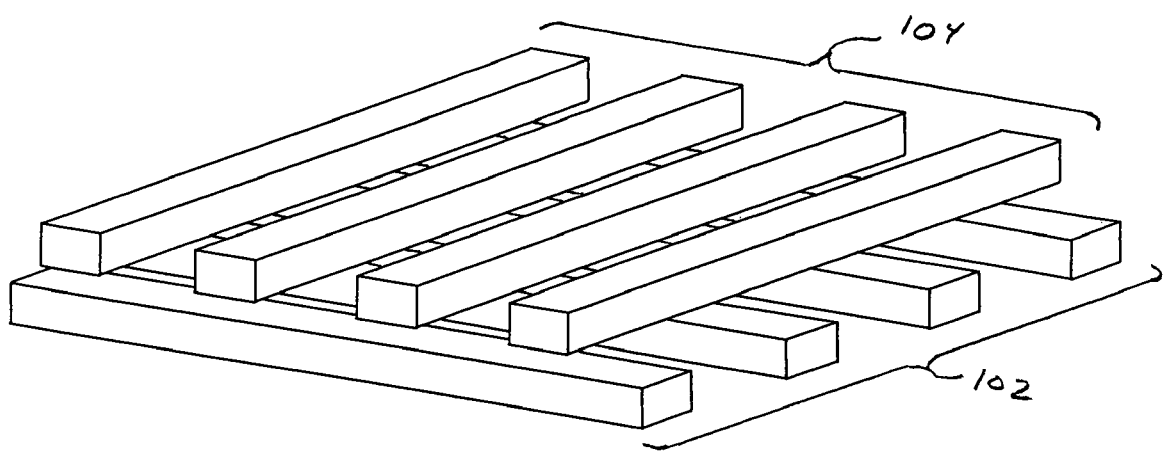
FIG. 1 illustrates a nanowire crossbar array.

Various embodiments of the present invention are directed to demultiplexers that include nonlinear tunneling resistor nanowire junctions and nanowire addressing methods for reliably addressing nanowires in demultiplexers. In order to assist in understanding descriptions of various embodiments of the present invention, a mathematical description of selected error-control encoding techniques is provided in a first subsection. In a second subsection, an overview of crossbar arrays is provided. In a third subsection, an overview of properties of tunneling resistors is provided, and in a fourth subsection, an overview of constant-weight codes is provided. Finally, in a fifth subsection, various device and method embodiments of the present invention are described.

Mathematical Description of Selected Error-Control Encoding Techniques

Embodiments of the present invention employ concepts derived from well-known techniques in error-control encoding. This subsection provides background information on error-correcting codes, and may be skipped by those familiar with these topics. An excellent reference for this field is the textbook "Error Control Coding: The Fundamentals and Applications," Lin and Costello, Prentice-Hall, Incorporated, New Jersey, 1983. In this subsection, a brief description of the error-detection and error-correction techniques used in error-control encoding are described. Additional details can be obtained from the above-referenced textbook, or from many other textbooks, papers, and journal articles in this field. The current subsection represents a rather mathematically precise, but concise, description of certain types of error-control encoding techniques. The current invention employs concepts inherent in these error-control encoding techniques for a different purpose.

Error-control encoding techniques systematically introduce supplemental bits or symbols into plain-text messages, or encode plain-text messages using a greater number of bits or symbols than absolutely required, in order to provide information in encoded messages to allow for errors arising in storage or transmission to be detected and, in some cases, corrected. One effect of the supplemental or more-than-absolutely-needed bits or symbols is to increase the distance between valid codewords, when codewords are viewed as vectors in a vector space and the distance between codewords is a metric derived from the vector subtraction of the codewords. The current invention employs concepts used in error-control coding to add supplemental address signal lines to increase the distance between valid addresses in order to correspondingly increase the signal separation, e.g. voltage or current, between ON and OFF states of address signal lines and to provide defective-junction tolerance in interface interconnections. Thus, in the current invention, the plain-text and encoded messages of error-control encoding are analogous to input addresses and coded addresses, and the additional or greater-number-than-needed symbols or bits in error-control encoding are analogous to supplemental or a greater-than-absolutely-needed number of internal address signal lines.

In describing error detection and correction, it is useful to describe the data to be transmitted, stored, and retrieved as one or more messages, where a message $\mu$ comprises an ordered sequence of symbols, $\mu_i$, that are elements of a field F. A message $\mu$ can be expressed as:

$$\mu=(\mu_0,\mu_1,\ldots \mu_{q-1})$$

where $\mu_i \epsilon F$.

The field F is a set that is closed under multiplication and addition, and that includes multiplicative and additive inverses. It is common, in computational error detection and correction, to employ fields comprising a subset of integers with sizes equal to a prime number, with the addition and multiplication operators defined as modulo addition and modulo multiplication. In practice, the binary field is commonly employed. Commonly, the original message is encoded into a message c that also comprises an ordered sequence of elements of the field F, expressed as follows:

$$c=(c_0,c_1,\ldots c_{n-1})$$

where $c_i \epsilon F$.

Block encoding techniques encode data in blocks. In this discussion, a block can be viewed as a message $\mu$ comprising a fixed number of symbols q that is encoded into a message c comprising an ordered sequence of n symbols. The encoded message c generally contains a greater number of symbols than the original message μ, and therefore n is greater than q. The r extra symbols in the encoded message, where r equals n−q, are used to carry redundant check information to allow for errors that arise during transmission, storage, and retrieval to be detected with an extremely high probability of detection and, in many cases, corrected.

In a linear block code, the $2^q$ codewords form a q-dimensional subspace of the vector space of all n-tuples over the field F. The Hamming weight of a codeword is the number of non-zero elements in the codeword, and the Hamming distance between two codewords is the number of elements in which the two codewords differ. For example, consider the following two codewords a and b, assuming elements from the binary field:

$a = (1\ 0\ 0\ 1\ 1)$ $b = (1\ 0\ 0\ 0\ 1)$

The codeword a has a Hamming weight of 3, the codeword b has a Hamming weight of 2, and the Hamming distance between codewords a and b is 1, since codewords a and b differ only in the fourth element. Linear block codes are often designated by a three-element tuple [n, q, d], where n is the codeword length, q is the message length, or, equivalently, the base-2 logarithm of the number of codewords, and d is the minimum Hamming distance between different codewords, equal to the minimal-Hamming-weight, non-zero codeword in the code.

The encoding of data for transmission, storage, and retrieval, and subsequent decoding of the encoded data, can be notationally described as follows, when no errors arise during the transmission, storage, and retrieval of the data:

$\mu \rightarrow c(s) \rightarrow c(r) \rightarrow \mu$ where c(s) is the encoded message prior to transmission, and c(r) is the initially retrieved or received, message. Thus, an initial message μ is encoded to produce encoded message c(s) which is then transmitted, stored, or transmitted and stored, and is then subsequently retrieved or received as initially received message c(r). When not corrupted, the initially received message c(r) is then decoded to produce the original message μ. As indicated above, when no errors arise, the originally encoded message c(s) is equal to the initially received message c(r), and the initially received message c(r) is straightforwardly decoded, without error correction, to the original message μ.

When errors arise during the transmission, storage, or retrieval of an encoded message, message encoding and decoding can be expressed as follows:

$\mu(s) \rightarrow c(s) \rightarrow c(r) \rightarrow \mu(r)$

Thus, as stated above, the final message μ(r) may or may not be equal to the initial message μ(s), depending on the fidelity of the error detection and error correction techniques employed to encode the original message μ(s) and decode or reconstruct the initially received message c(r) to produce the final received message μ(r). Error detection is the process of determining that:

$c(r) \neq c(s)$ while error correction is a process that reconstructs the initial, encoded message from a corrupted initially received message:

$c(r) \rightarrow c(s)$

The encoding process is a process by which messages, symbolized as μ, are transformed into encoded messages c. Alternatively, a message μ can be considered to be a word comprising an ordered set of symbols from the alphabet comprising elements of F, and the encoded messages c can be considered to be a codeword also comprising an ordered set of symbols from the alphabet of elements of F. A word μ can be any ordered combination of q symbols selected from the elements of F, while a codeword c is defined as an ordered sequence of n symbols selected from elements of F via the encoding process:

$\{c:\mu \rightarrow c\}$

Linear block encoding techniques encode words of length q by considering the word μ to be a vector in a q-dimensional vector space, and multiplying the vector μ by a generator matrix, as follows:

$c = \mu \cdot G$

Notationally expanding the symbols in the above equation produces either of the following alternative expressions:

$$(c_0, c_1, \ldots, c_{n-1}) = (\mu_0, \mu_1, \ldots, \mu_{q-1}) \begin{pmatrix} g_{00} & g_{01} & g_{02} & \cdots & g_{0,n-1} \\ \vdots & & & \ddots & \vdots \\ g_{q-1,0} & g_{q-1,1} & g_{q-1,2} & \cdots & g_{q-1,n-1} \end{pmatrix}$$

$$(c_0, c_1, \ldots, c_{n-1}) = (\mu_0, \mu_1, \ldots, \mu_{q-1}) \begin{pmatrix} g_0 \\ g_1 \\ \vdots \\ g_{q-1} \end{pmatrix}$$

where $g_i = (g_{i,0}, g_{i,1}, g_{i,2} \cdots g_{i,n-1})$.

The generator matrix G for a linear block code can have the form:

$$G_{q,n} = \begin{pmatrix} p_{0,0} & p_{0,1} & \cdots & p_{0,r-1} & 1 & 0 & 0 & \cdots & 0 \\ p_{1,0} & p_{1,1} & \cdots & p_{1,r-1} & 0 & 1 & 0 & \cdots & 0 \\ \vdots & \vdots & \cdots & & 0 & 0 & 1 & \cdots & 0 \\ \vdots & \vdots & \cdots & & \vdots & \vdots & \vdots & \cdots & \vdots \\ \vdots & \vdots & \cdots & & \vdots & \vdots & \vdots & \cdots & \vdots \\ p_{q-1,0} & p_{q-1,1} & \cdots & p_{q-1,r-1} & 0 & 0 & 0 & \cdots & 1 \end{pmatrix}$$

or, alternatively:

$G_{q,n} = [P_{q,r} | I_{q,q}]$.

Thus, the generator matrix G can be placed into a matrix P augmented with a q by q identity matrix $I_{q,q}$. A code generated by a generator in this form is referred to as a "systematic code." When this generator matrix is applied to a word μ, the resulting codeword c has the form:

$c = (c_0, c_1, \ldots, c_{r-1}, \mu_0, \mu_1, \ldots, \mu_{q-1})$ where $c_i = \mu_0 p_{0,i} + (\mu_1 p_{1,i}, \ldots, \mu_{q-1} p_{q-1,i})$.

Note that, in this discussion, a convention is employed in which the check symbols precede the message symbols. An alternate convention, in which the check symbols follow the message symbols, may also be used, with the parity-check and identity submatrices within the generator matrix interposed to generate codewords conforming to the alternate convention. Thus, in a systematic linear block code, the codewords comprise r parity-check symbols $c_i$ followed by the symbols comprising the original word μ. When no errors arise, the original word, or message μ, occurs in clear-text form within, and is easily extracted from, the corresponding codeword. The parity-check symbols turn out to be linear combinations of the symbols of the original message, or word μ.

One form of a second, useful matrix is the parity-check matrix $H_{r,n}$, defined as:

$$H_{r,n} = [I_{r,r} | -P^T]$$

or, equivalently, $$H_{r,n} = \begin{pmatrix} 1 & 0 & 0 & \cdots & 0 & -p_{0,0} & -p_{1,0} & -p_{2,0} & \cdots & -p_{q-1,0} \\ 0 & 1 & 0 & \cdots & 0 & -p_{0,1} & -p_{1,1} & -p_{2,1} & \cdots & -p_{q-1,1} \\ 0 & 0 & 1 & \cdots & 0 & -p_{0,2} & -p_{1,2} & -p_{2,2} & \cdots & -p_{q-1,2} \\ \vdots & \vdots & \vdots & \cdots & \vdots & \vdots & \vdots & \vdots & \cdots & \vdots \\ 0 & 0 & 0 & \cdots & 1 & -p_{0,r-1} & -p_{1,r-1} & -p_{0,r-1} & \cdots & -p_{q-1,r-1} \end{pmatrix}.$$

The parity-check matrix can be used for systematic error detection and error correction. Error detection and correction involves computing a syndrome S from an initially received or retrieved message c(r) as follows:

$$S = (s_0, s_1, \ldots, s_{r-1}) = c(r) \cdot H^T$$

where $H^T$ is the transpose of the parity-check matrix $H_{r,n}$ expressed as:

$$H^T = \begin{pmatrix} 1 & 0 & 0 & \cdots & 0 \\ 0 & 1 & 0 & \cdots & 0 \\ 0 & 0 & 1 & \cdots & 0 \\ \vdots & \vdots & \vdots & \cdots & 1 \\ -p_{0,0} & -p_{0,1} & -p_{0,2} & \cdots & -p_{0,r-1} \\ -p_{1,0} & -p_{0,1} & -p_{0,2} & \cdots & -p_{0,r-1} \\ -p_{2,0} & -p_{0,1} & -p_{0,2} & \cdots & -p_{0,r-1} \\ \vdots & \vdots & \vdots & \cdots & \vdots \\ -p_{q-1,0} & -p_{q-1,1} & -p_{q-1,2} & \cdots & -p_{q-1,r-1} \end{pmatrix}.$$

Note that, when a binary field is employed, x=−x, so the minus signs shown above in $H^T$ are generally not shown.

Hamming codes are linear codes created for error-correction purposes. For any positive integer m greater than or equal to 3, there exists a Hamming code having a codeword length n, a message length q, number of parity-check symbols r, and minimum Hamming distance $d_{min}$ as follows:

$$n = 2^m - 1$$

$$q = 2^m - m - 1$$

$$r = n - q = m$$

$$d_{min} = 3$$

The parity-check matrix H for a Hamming Code can be expressed as:

$$H = [I_m | Q]$$

where $I_m$ is an m×m identity matrix and the submatrix Q comprises all $2^m - m - 1$ distinct columns which are m-tuples each having 2 or more non-zero elements. For example, for m=3, a parity-check matrix for a [7,4,3] linear block Hamming code is $$H = \begin{pmatrix} 1 & 0 & 0 & 0 & 1 & 1 & 1 \\ 0 & 1 & 0 & 1 & 1 & 1 & 0 \\ 0 & 0 & 1 & 1 & 0 & 1 & 1 \end{pmatrix}$$

A generator matrix for a Hamming code is given by:

$$G = [Q^T I_{2^m - m - 1}]$$

where $Q^T$ is the transpose of the submatrix Q, and $I_{2^m-m-1}$ is a $(2^m-m-1) \times (2^m-m-1)$ identity matrix. By systematically deleting l columns from the parity-check matrix H, a parity-check matrix H' for a shortened Hamming code can generally be obtained, with:

$$n = 2^m - l - 1$$

$$q = 2^m - m - l - 1$$

$$r = n - q = m$$

$$d_{min} \geq 3$$

As will be discussed, below, one embodiment of the present invention involves employing the above-described error-control coding techniques to a very different problem space, in which, rather than generating codewords of length q+r from messages of length q, interconnections between q+r internal signal lines are generated from addresses input into q input signal lines. In other words, one embodiment of the present invention involves applying error-control coding techniques to addresses within an address space of up to size $2^q$ to generate interconnection mappings between address signal lines and up to $2^q$ signal lines addressed by the $2^q$ addresses.

Other types of codes are employed to increase the Hamming distance between codewords in various applications. Many of these alternative codes do not have the convenient properties of linear block codes, including easy generation using generator matrices, and the transparent, pass-through feature of linear block codes allowing for the encoded value to be directly read from the code word. For linear block codes, a plain-text message transfers directly to a codeword containing, in addition, parity-check symbols or bits. In other types of codes, the plain-text message is not directly readable in a corresponding codeword. In both cases, codewords contain a greater number of symbols or bits than absolutely needed to enumerate all valid messages to be encoded. In the case of linear block codes, the additional symbols or bits are parity-check symbols or bits that supplement the plain-text symbols or bits, while in the other types of codes, valid messages are distributed throughout a vector space of dimension equal to the codeword size.

Combinatoric codes provide a straightforward approach to increasing the Hamming distance between codewords. To create a combinatoric code (also known as a "constant-weight code" or an "r-hot code"), one may select combinations of r bits having a fixed number of 1's from a total codeword space of n bits to produce $$C_r^n = \frac{n!}{r!(n-r)!}$$

codewords of length n. Of course, one can produce a symmetrical code with an identical number of codewords by choosing combinations of r bits having a fixed number of 0's from a total codeword space of n bits. For example, a combinatoric code including $$C_r^n = \frac{n!}{r!(n-r)!} = 165$$

codewords can be obtained by choosing all possible 11-bit codewords with exactly three bits having the value "1," the codewords provided in the following table:

TABLE 1

| | | | | | |
|---|---|---|---|---|---|
| 11100000000 | 11010000000 | 11001000000 | 11000100000 | 11000010000 | 11000001000 |
| 11000000100 | 11000000010 | 11000000001 | 10110000000 | 10101000000 | 10100100000 |
| 10100010000 | 10100001000 | 10100000100 | 10100000010 | 10100000001 | 10011000000 |
| 10010100000 | 10010010000 | 10010001000 | 10010000100 | 10010000010 | 10010000001 |
| 10001100000 | 10001010000 | 10001001000 | 10001000100 | 10001000010 | 10001000001 |
| 10000110000 | 10000101000 | 10000100100 | 10000100010 | 10000100001 | 10000011000 |
| 10000010100 | 10000010010 | 10000010001 | 10000001100 | 10000001010 | 10000001001 |
| 10000000110 | 10000000101 | 10000000011 | 01110000000 | 01101000000 | 01100100000 |
| 01100010000 | 01100001000 | 01100000100 | 01100000010 | 01100000001 | 01011000000 |
| 01010100000 | 01010010000 | 01010001000 | 01010000100 | 01010000010 | 01010000001 |
| 01001100000 | 01001010000 | 01001001000 | 01001000100 | 01001000010 | 01001000001 |
| 01000110000 | 01000101000 | 01000100100 | 01000100010 | 01000100001 | 01000011000 |
| 01000010100 | 01000010010 | 01000010001 | 01000001100 | 01000001010 | 01000001001 |
| 01000000110 | 01000000101 | 01000000011 | 00111000000 | 00110100000 | 00110010000 |
| 00110001000 | 00110000100 | 00110000010 | 00110000001 | 00101100000 | 00101010000 |
| 00101001000 | 00101000100 | 00101000010 | 00101000001 | 00100110000 | 00100101000 |
| 00100100100 | 00100100010 | 00100100001 | 00100011000 | 00100010100 | 00100010010 |
| 00100010001 | 00100001100 | 00100001010 | 00100001001 | 00100000110 | 00100000101 |
| 00100000011 | 00011100000 | 00011010000 | 00011001000 | 00011000100 | 00011000010 |
| 00011000001 | 00010110000 | 00010101000 | 00010100100 | 00010100010 | 00010100001 |
| 00010011000 | 00010010100 | 00010010010 | 00010010001 | 00010001100 | 00010001010 |
| 00010001001 | 00010000110 | 00010000101 | 00010000011 | 00001110000 | 00001101000 |
| 00001100100 | 00001100010 | 00001100001 | 00001011000 | 00001010100 | 00001010010 |
| 00001010001 | 00001001100 | 00001001010 | 00001001001 | 00001000110 | 00001000101 |
| 00001000011 | 00000111000 | 00000110100 | 00000110010 | 00000110001 | 00000101100 |
| 00000101010 | 00000101001 | 00000100110 | 00000100101 | 00000100011 | 00000011100 |
| 00000011010 | 00000011001 | 00000010110 | 00000010101 | 00000010011 | 00000001110 |
| 00000001101 | 00000001011 | 00000000111 | | | |

It is somewhat more complex to encode messages into combinatoric codes, but the logic to do so may be straightforwardly constructed at the logic-circuit level. Combinatoric codes have a guaranteed minimum Hamming distance of 2, and may have significantly better average Hamming distance separations between codewords. For example, in the above $$C_3^{11}$$

code, the average Hamming distance between codewords is 4.39. Combinatoric codes also have an advantage in producing total signal distinguishability within relatively narrow ranges, since these codes have constant weights, where the weight is defined as the number of bits having the value "1."

Another, similar type of code, referred to as a "random" code, is obtained by choosing random codewords of fixed length. For example, one can choose a fixed-length, binary, n-bit codeword size, and select a sufficient number of random n-bit binary numbers in order to obtain a desired number of binary codewords $2^q$, where n>Aq. The greater the value of A, the greater the expected minimum Hamming distance between the codewords. When creating random codes, distance checking can be carried out to reject new codewords that have a Hamming distance less than a minimum value with respect to those codewords already selected, and random codewords having approximately equal numbers of "1" and "0" bits can be used in order to obtain an increased average Hamming distance and increased expected minimum Hamming distance.

Yet another type of code that may be employed in the methods and systems of the present invention is a random linear code. In a random linear code, the generator matrix is randomly generated, under linearity constraints, rather than generated as the combination of a parity-check matrix generated from linear sums of information elements that represent parity-check sums, and an identity matrix. A random linear block code is generally not systematic, but linear.

A complementary repeated code is a complementary repetition code based on a linear block code, constructed by appending the complement of each codeword in the linear block code to the codeword to produce a balanced-linear-code codeword. The complementary repeated code generated in this fashion from a [n, q, d] linear code produces a constant-weight code. Constant-weight codes are described in a following subsection.

Crossbar Arrays and Nanowire Junctions

FIG. 1 illustrates a nanowire crossbar array. In FIG. 1, a first layer of approximately parallel nanowires 102 is overlain by a second layer of approximately parallel nanowires 104. The second layer 104 is roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at nanowire intersections that represent the closest contact between two nanowires. Although individual nanowires in FIG. 1 are shown with rectangular cross sections, nanowires can also have square, circular, elliptical, or more complex cross sections. The nanowires may also have many different widths or diameters and aspect rations or eccentricities. The term "nanowire crossbar" may refer to crossbars having one or more layers of sub-microscale wires, microscale wires, or wires with larger dimensions, in addition to nanowires.

Nanowire layers can be fabricated by mechanical nanoimprinting techniques. Alternatively, nanowires can be chemically synthesized and can be deposited as layers of approximately parallel nanowires in one or more process steps, including Langmuir-Blodgett processes. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

Figure 2A:
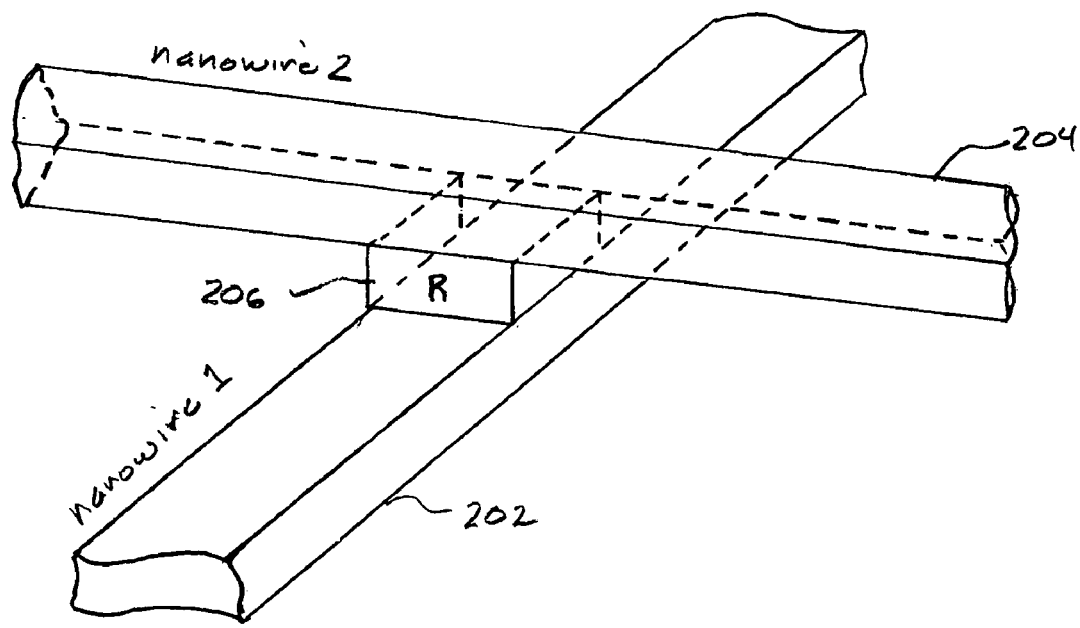
FIGS. 2A–2B provide two different illustrations of a nanowire junction that interconnects nanowires of two contiguous layers within a nanowire crossbar.
Figure 2B:
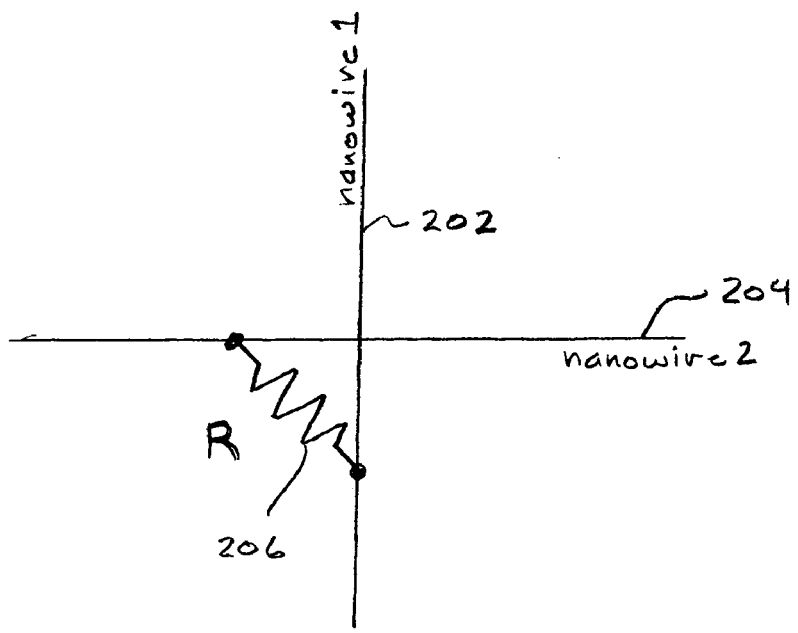

At nanowire intersections, nanoscale electronic components, such as resistors, and other familiar basic electronic components, can be fabricated to interconnect two overlapping nanowires. FIGS. 2A–2B provide two different illustrations of a nanowire junction that interconnects nanowires 202 and 204 of two contiguous layers within a nanowire crossbar. The nanowire junction may or may not involve physical contact between the two nanowires 202 and 204. As shown in FIG. 2A, the two nanowires are not in physical contact at their overlap point, but the gap between the nanowires 202 and 204 is spanned by a number of molecules represented by resistive element 206 that lies between the two nanowires at their closest point of contact. The resistive element 206 may be composed or one or more molecules that behave as a resistor. In certain embodiments of the present invention, the resistive element 206 may be introduced in a separate layer, referred to as "intermediate layer," formed between the layers of overlapping nanowires and configured, as described below with reference to FIGS. 3A–3D.

The electronic properties, such as resistance, of nanowire-junction molecules can vary according to the particular molecular configuration or electronic state of the nanowire-junction molecules. In some cases, changes in the state of nanowire-junction molecules may not be reversible. In other cases, the nanowire-junction molecules may be conductive, but the molecules may be irreversibly damaged, along with portions of the nanowires proximal to the nanowire junctions, through application of very high voltages, resulting in disrupting conductivity between the two nanowires and breaking an electrical connection between them. In yet other cases, the nanowire-junction molecules may transition reversibly from one state to another and back, so that the resistive elements configured at nanowire junctions may be reconfigured, or programmed, by application of differential voltages to selected nanowire junctions. FIG. 2B illustrates a schematic representation of the resistive element 206 and overlapping nanowires 202 and 204 shown in FIG. 2A. The schematic representation shown in FIG. 2B is used to represent resistive nanowire junctions throughout the remaining figures.

Various different types of molecules may be introduced at nanowire junctions for a variety of different purposes, such as to control the level of current passing between two overlapping nanowires. The molecules spanning a nanowire junction, as shown in FIG. 2A, may have various different states in which the molecules exhibit resistive, semiconductor-like, or conductive electrical properties. The states, and relative energies of the states, of the nanowire-junction molecules may be controlled by applying differential current levels or voltages to the overlapping nanowires forming the nanowire junction. For example, certain states of a nanowire-junction molecule can be set by applying voltages to nanowires of a nanowire junction. The applied voltages can change the redox state of the nanowire-junction molecule causing the nanowire-junction molecule to operate as a conductor in a reduced state or operate as an insulator in an oxidized state.

Figure 3A:
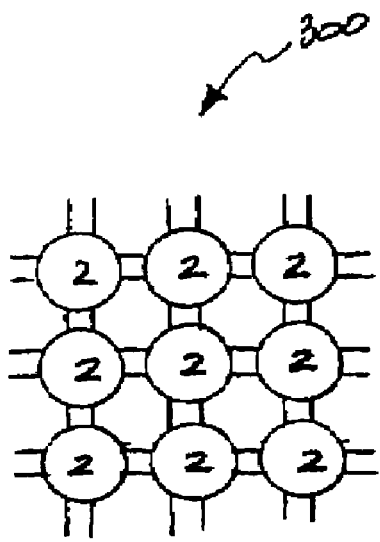
FIGS. 3A–3D illustrate one possible approach to configuring a network of reconfigurable nanoscale electrical components from a two-layer nanowire crossbar.
Figure 3B:
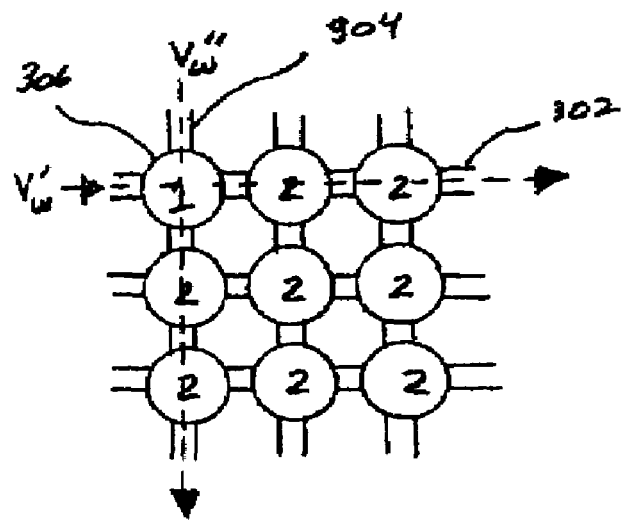
Figure 3C:
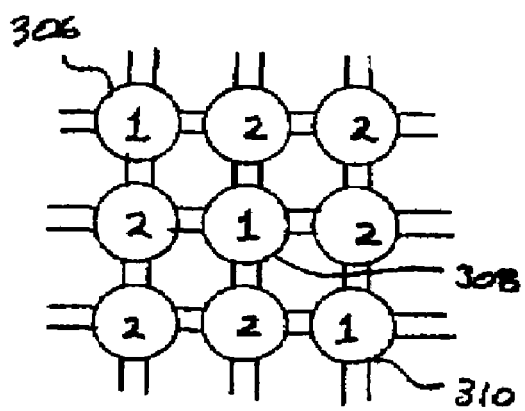
Figure 3D:
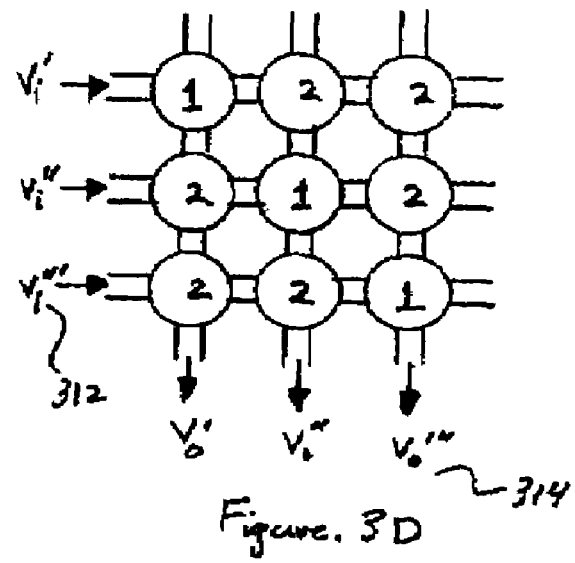

Nanowire junctions can be configured electrically, optically, mechanically or by other means. FIGS. 3A–3D illustrate one possible approach to configuring a network of reconfigurable nanoscale electrical components from a two-layer nanowire crossbar. The example of FIGS. 3A–3D are meant to illustrate a general process by which nanowire crossbars may be configured as useful portions of electronic circuits. In FIGS. 3A–3D, a small 3×3 nanowire crossbar is shown, with circles at all nine nanowire junctions, each circle indicating the state of the nanowire-junction molecules. In one state, labeled "1" in FIGS. 3A–3D, the nanowire-junction molecules may have resistive properties, while in a second state, labeled "2" in FIGS. 3A–3D, the nanowire-junction molecules may have different properties that cause the nanowire-junction molecules to acts a insulators. Initially, as shown in FIG. 3A, the states of the nanowire junctions of the nanowire crossbar 300 are labeled "2." Next, as shown in FIG. 3B, each nanowire junction may be uniquely accessed by applying a WRITE voltage, or configuring voltage, to the nanowires that insected to form the nanowire junction in order to configure, or program, the nanowire junction to have the state "1." For example, in FIG. 3B, a first WRITE voltage $v_w'$ is applied to horizontal nanowire 302 and a second WRITE voltage $v_w''$ is applied to vertical nanowire 304 to change the state of the nanowire junction 306 from "2" to "1." Individual nanowire junctions may be configured through steps similar to the steps shown in FIG. 3B, resulting in a fully configured nanoscale component network as shown in FIG. 3C. In FIG. 3C, the states of nanowire junctions 306, 308, and 310 form a downward-slanted diagonal through the nanowire crossbar that have been configured by selective application of WRITE voltages. As shown in FIG. 3D, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input voltages $v_i'$, $v_i''$, and $v_i'''$ and the output voltages $v_o'$, $v_o''$, and $v_o'''$ have relatively low magnitudes compared with the WRITE voltages $v_w$. Depending on the types of nanowires, types of dopants employed in the case of semiconductor nanowires, and the types of nanowire-junction molecules employed in the nanowire crossbar, many different configuring processes may be used to configure nanowire crossbars into nanowire-based electrical components networks.

Properties of Nonlinear Tunneling Resistor Junctions

A current flowing between two overlapping nanowires interconnected by nanowire-junction molecules that operate as a nonlinear tunneling resistor can be modeled by the current-voltage equation:

$$I = \frac{1}{2}(ke^{aV} - ke^{-aV}) = k\,\sinh(aV)$$

where I is current flowing through the nanowire junction,
V is a voltage across the nanowire junction,
k is the quasi-conductance of the nanowire junction, and
a is a voltage scale factor.

The quasi-conductance, k, and scale factor, a, are parameters determined by the physical properties of nanowire-junction molecules. The scale factor, a, represents resistive properties of the nanowire junction and can be used to characterize changes in the current flowing through the nanowire junction based on changes in the voltages between the overlapping nanowires. The parameter k is analogous to the conductance, g=1/R, of a linear resistor, where R represents resistance. Nonlinear tunneling resistors that operate in accordance with the current-voltage equation given above are also referred to as "tunneling resistors."

Figure 4:
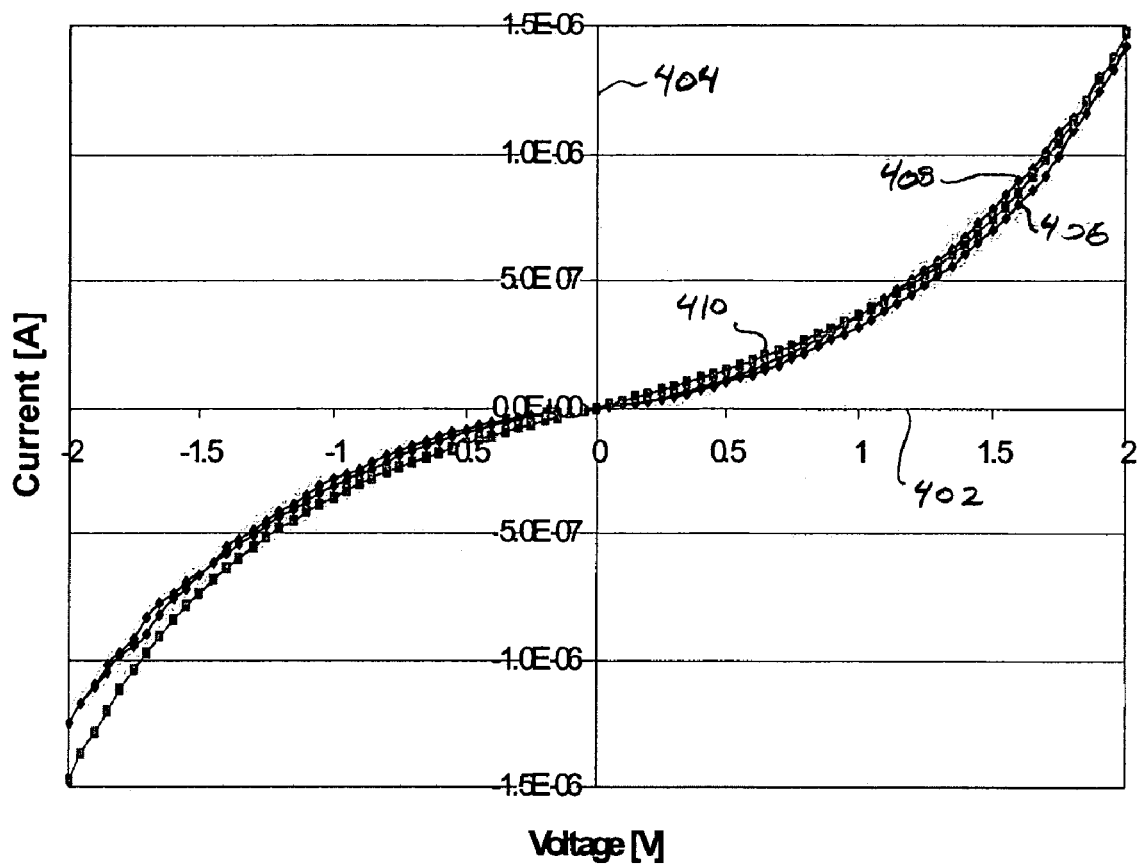
FIG. 4 shows a current-versus-voltage plot of data generated by a nanoscale, tunneling resistor junction fabricated in a crossbar array and a current-voltage equation fit to the data.

FIG. 4 shows a current-versus-voltage plot of data that describes operation of a nanoscale, tunneling resistor junction fabricated in a crossbar array. In FIG. 4, horizontal line 402 represents a voltage axis, and vertical line 404 represents a current axis. Curves 406 and 408 are plots of two current-versus-voltage data sets obtained by application of voltages between −2V and 2V to a nanoscale, tunneling resistor junction of dimensions 75 nm by 30 nm. Curve 410 is a plot of a current-voltage equation that has been fit to the data represented by curves 406 and 408:

$$I = 2\times 10^{-7} \sin h(1.3455V)$$

The curve 410 shows that the current-voltage equation is a good representation of nanoscale tunneling resistors fabricated at nanowire junctions in crossbar arrays. The nonlinear properties of tunneling resistor molecules, shown in FIG. 4, are the result of quantum-mechanical tunneling of electrons through relatively low-energy, unoccupied quantum states of the nanowire-junction molecules. In FIG. 4, the current versus voltage curves exhibit inversion symmetry at the origin, since reversing the voltages applied to overlapping nanowires of a tunneling resistor junction changes the direction of current flow, but does not affect the magnitude of the current, |I|, flowing through the tunneling resistor junction.

Figure 5:
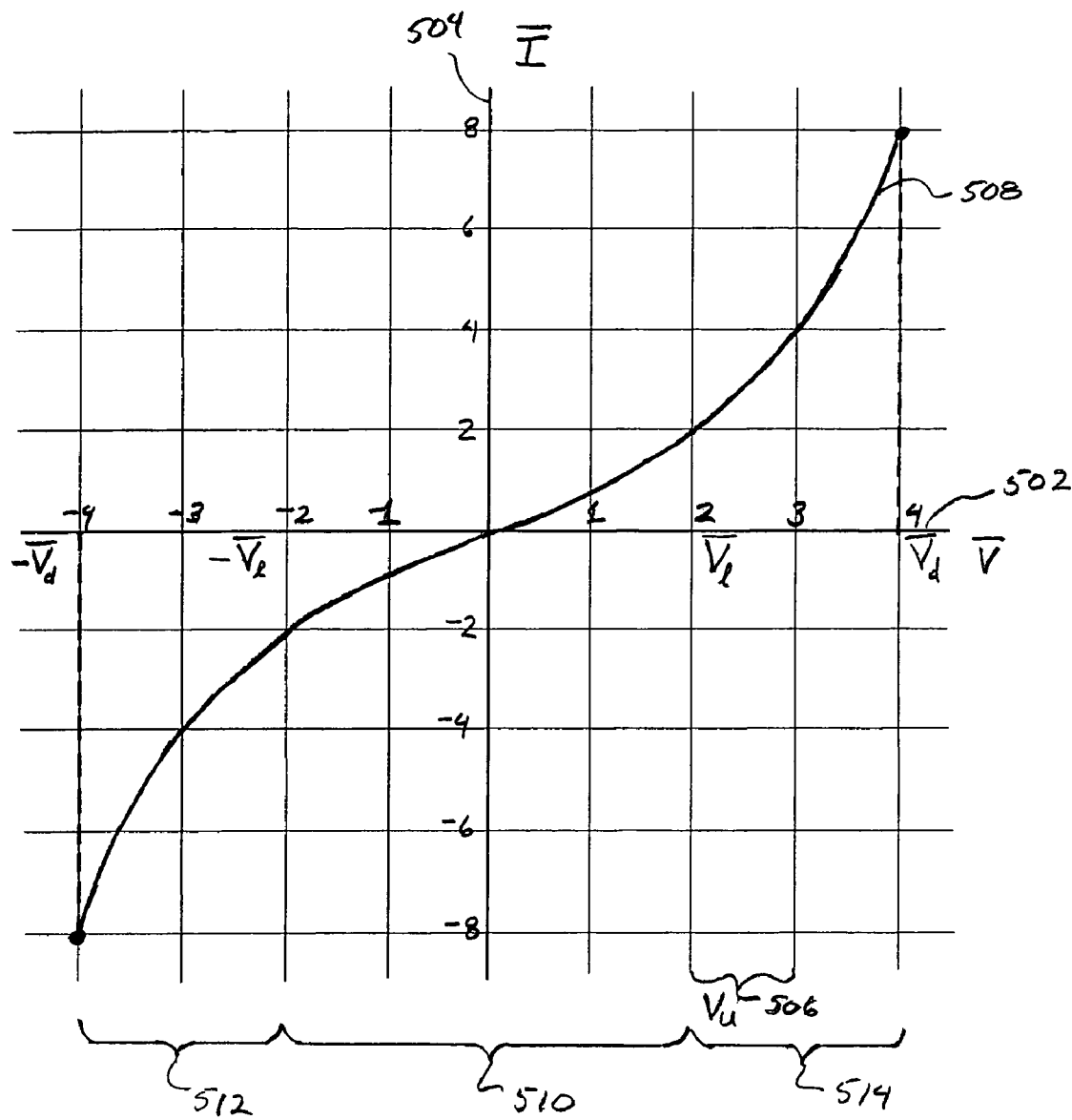
FIG. 5 shows a current-versus-voltage curve corresponding to the operational characteristics of a tunneling resistor junction.

FIG. 5 shows a current-versus-voltage curve that describes the operational characteristics of a tunneling resistor junction. In FIG. 5, horizontal line 502 represents a normalized voltage axis, and vertical line 504 represents a normalized current axis. The voltages represented by the voltage axis are normalized according to:

$$\overline{V} = \frac{V}{V_u},$$

where $V_u$ 506 equals ln 2/a and is referred to as the "unit voltage step." The currents are normalized according to:

$$\overline{I} = \frac{I}{k}$$

Curve 508 represents a normalized current-voltage for a tunneling resistor junction, operation of which is expressed by:

$$\overline{I} = \sinh(aV) = \sinh\frac{V\ln 2}{V_u}$$

The curve 508 shows qualitatively different regions of behavior that are identified as a linear region 510 and two exponential regions 512 and 514. In the linear region 510, the curve 508 shows a nearly linear current-versus-voltage relationship that can be approximated by:

$$I \approx k\cdot a\cdot V$$

for $|\overline{V}| < |\overline{V}_l|$, where $\pm\overline{V}_l$ are linear current-versus-voltage threshold voltages. The linear region 510 indicates that, for voltages with magnitudes less than the linear threshold voltage magnitude, $|\overline{V}_l|$, the tunneling resistor junction operates as a linear resistor junction with a conductance ka. The linear region 510 also shows that as the magnitude of the voltage across a tunneling resistor junction decreases, the resistance of the nanowire junction is nearly constant. As a result, the magnitude of the current flowing through the tunneling resistor junction decreases to zero. By contrast, in the exponential regions 512 and 514, the curve 508 shows a nonlinear current-versus-voltage relationship that can be approximated by:

$$\overline{I} \approx sgn(\overline{V})\cdot k\cdot 2^{|\overline{V}|-1}$$

for $|\overline{V}| \geq |\overline{V}_l|$, where $sgn(\overline{V})$ is the sign of $\overline{V}$. The exponential regions 512 and 514 show that, for voltages with magnitudes greater than the threshold voltage, $|\overline{V}_l|$, the resistance of a tunneling resistor junction decreases, and the current flowing through the nanowire junction increases exponentially. Voltages $\pm\overline{V}_d$ represent the lower and upper bounds of a domain of normalized voltages that can be applied to tunneling resistor junctions. Applying voltages that are greater than $|\overline{V}_d|$ to a tunneling resistor junction irreversibly damages the molecules spanning the junction, rendering the junction inoperable and breaking the electrical connection between overlapping nanowires.

Figure 6A:
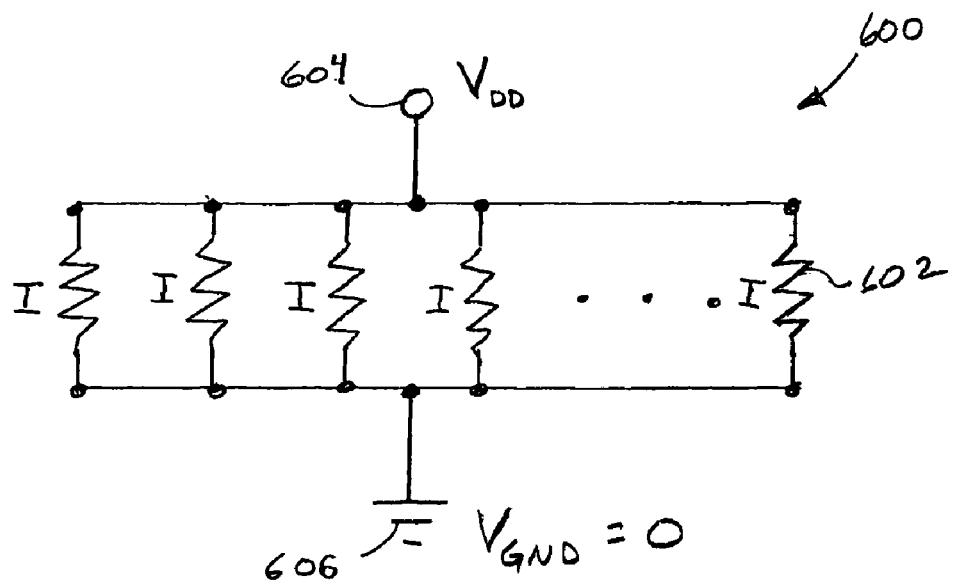
FIG. 6A illustrates a bundle of parallel tunneling resistors, each tunneling resistor having an identical scale factor $a_0$ and quasi-conductance $k_0$.

Tunneling resistors have a number of properties in common with linear resistors. For example, the total current flowing through a bundle of m parallel linear resistors, each with an identical conductance g, is the sum of the currents flowing through each resistor, and can be represented by a single linear resistor with a conductance mg. FIG. 6A illustrates a number of parallel tunneling resistors 600, each tunneling resistor having an identical scale factor $a_0$ and quasi-conductance $k_0$. In FIG. 6A, each tunneling resistor

602 provides a path for current to flow from source $V_{DD}$ 604 to ground 606. The total current, $I_{Total}$, flowing from the source $V_{DD}$ 604 to the ground 606 is evenly divided into m paths, each path carrying the same current I. The total current flowing through the parallel tunneling resistors 600 is given by:

$$I_{Total} = mI = (mk_0) \sin h(a_0 V),$$

and shows that the number of parallel tunneling resistors can be represented by a single equivalent tunnel resistor with the scale factor $a_0$ and quasi-conductance $mk_0$.

Figure 6B:
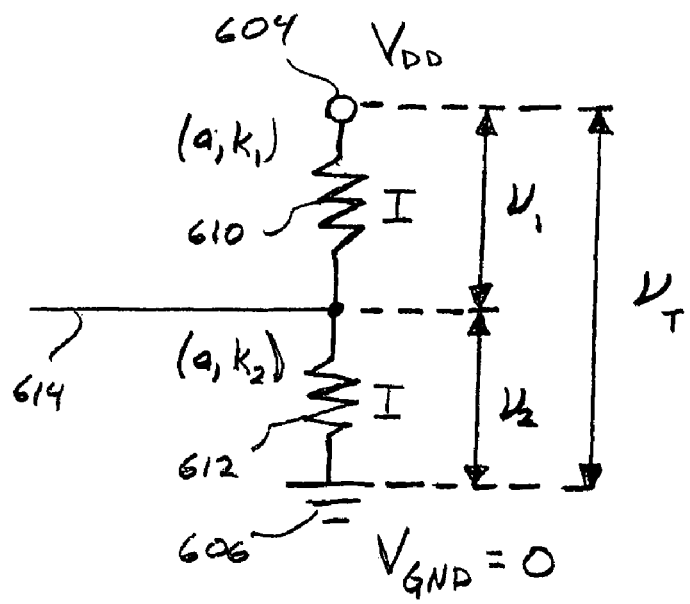
FIG. 6B illustrates a voltage divider composed of two tunneling resistors.

Tunneling resistors can also be connected in series and used to fabricate voltage dividers. FIG. 6B illustrates a voltage divider composed of two tunneling resistors. In FIG. 6B, the top tunneling resistor 610 and the bottom tunneling resistor 612 divide the total voltage between the source 604 and the ground 606 as follows:

$$v_T = v_1 + v_2$$

where $v_1$ is the voltage across the top resistor 610, and $v_2$ is the voltage across the bottom resistor 612. The current flowing through the top tunneling resistor 610 equals the current flowing through the bottom tunneling resistor 612 and is represented by:

$$k_1 \sin h(av_1) = k_2 \sin h(av_2)$$

A wire 614 connected to a wire that connects the top tunneling resistor 610 and the bottom tunneling resistor 612 has a voltage equal to the voltage drop across tunneling resistor 610 subtracted from the total voltage, $v_T - v_1$, or, in other words, the voltage drop across tunneling resistor 612. The voltage carried by the wire 614 and is:

$$v_w = \frac{1}{a} \tanh^{-1} \left( \frac{\sin h(av_T)}{\frac{k_2}{k_1} + \sin h(av_T)} \right)$$

Constant-Weight Codes

Constant-weight codes are a superclass of complementary repeated codes. However, unlike complementary repeated codes, there are generally no simple matrix generators for constant-weight codes, although based on a certain class of relatively inefficient constant-weight codes can be generated from complementary repeated codes. Constant-weight codes are well-known error-control-encoding codes, and many examples of constant-weight codes with desirable properties have been developed and published.

For the purposes of the current discussion, constant-weight codes can be thought of as represented by code tables. FIG. 7 shows a table representing a constant-weight error-control-encoding code. The table 702 shown in FIG. 7 includes a first column 704 containing a list of addresses $a_1 - a_{m-1}$, and a second column 706 of corresponding code words $u_1 - u_{m-1}$. Thus, there is a unique code word $u_i$ that corresponds to each address $a_i$. In the constant-weight-code table 702 in FIG. 7, the first four rows 708 contain addresses and corresponding code words represented as binary numbers, while the remaining rows show symbolic representations of the addresses and corresponding code words. The addresses all have a fixed length, in binary digits, of q. The code words have a fixed length of n binary digits. The number of code words in the constant-weight code is M, or, in other words, the length of the table. In many linear block codes, code sizes are exact powers of two. Constant weight codes, by contrast, are not. Therefore, while $q = \log_2 M$ for many linear block codes, q is generally equal to ceiling($\log_2 M$) for constant weight codes.

Figure 8:
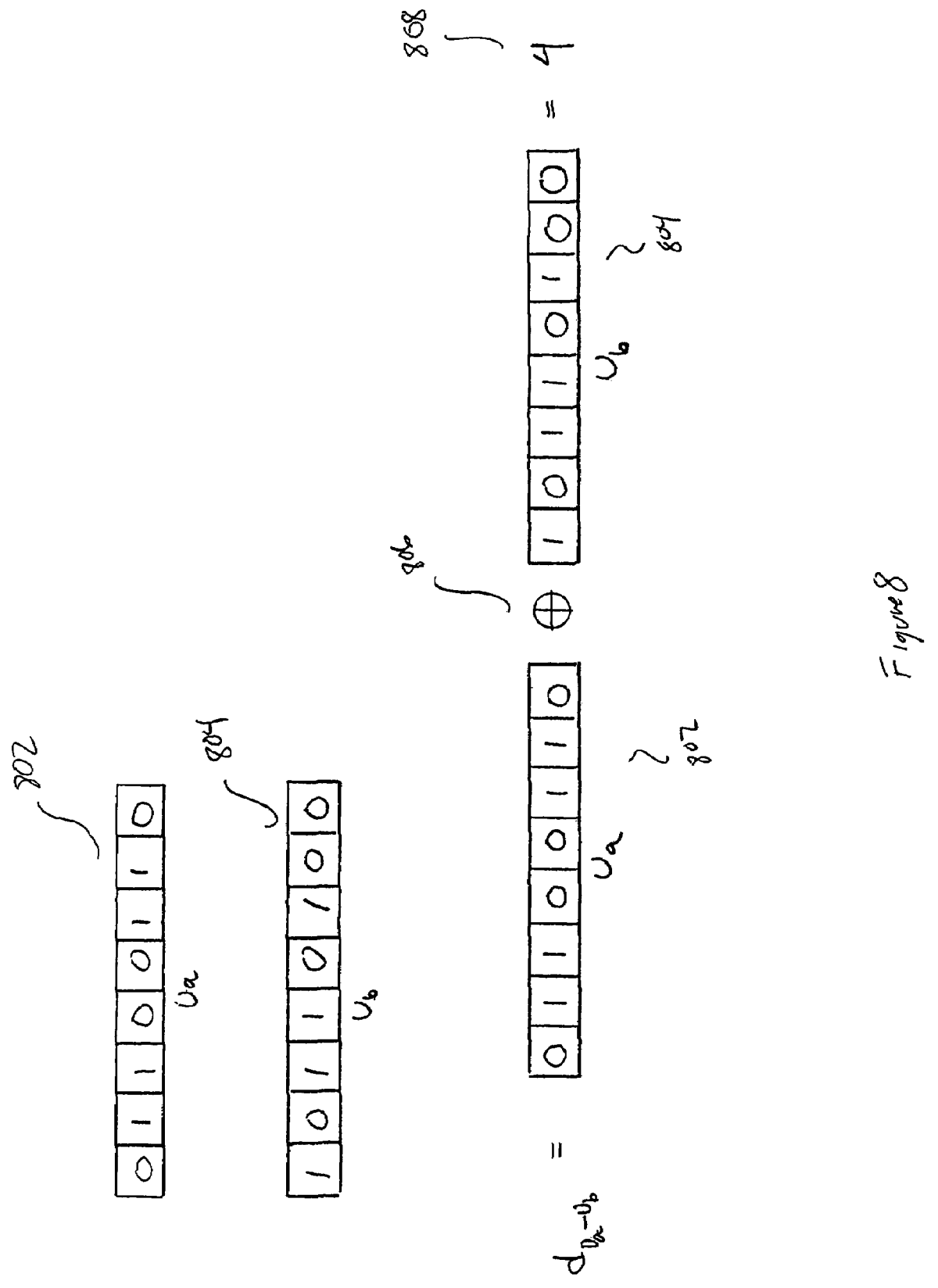

FIG. 8 illustrates computation of the distance between two code words, $u_a$ and $u_b$, of a binary code, such as a constant-weight code. FIG. 8 shows binary, row-vector representations of two code words $u_a$ 802 and $u_b$ 804 and illustrates the calculation of the distance between code words $u_a$ and $u_b$. The distance is defined as:

$$d(u_a, u_b) = w(u_a XOR u_b)$$

where w refers to the weight of the exclusive OR ("XOR") 806 of code words $u_a$ 802 and $u_b$ 804. For the particular code words shown in FIG. 8, the distance equals 4 (808 in FIG. 8), which is the number of positions within the bit-vector representations of the code words at which the two code words differ in value.

Figure 9:
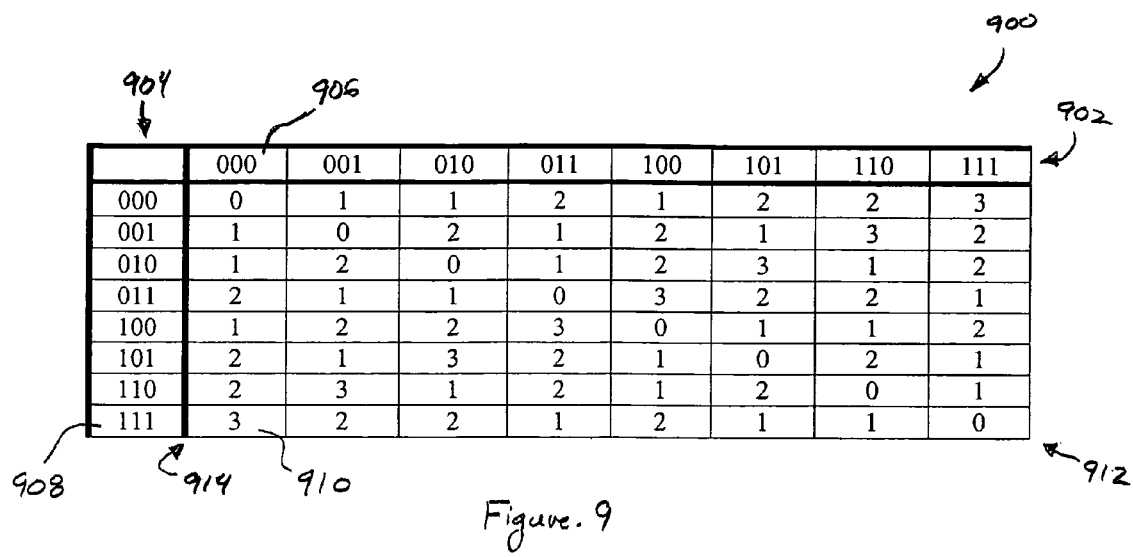
FIG. 9 shows a table of distances between all pairs of three-bit code words.
Figure 10:
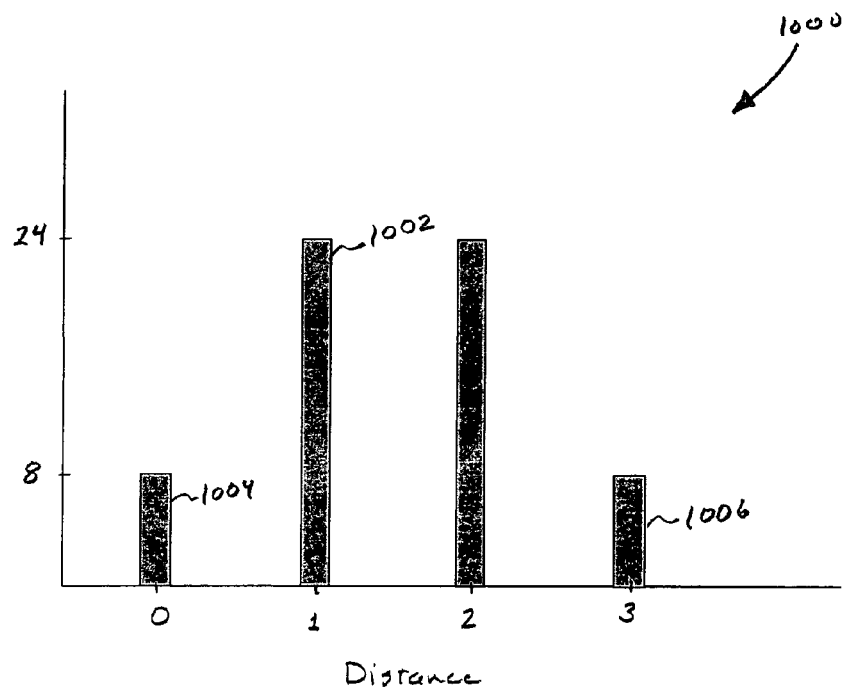
FIG. 10 shows a distance profile for the set of three-bit numbers discussed with reference to FIG. 9.

FIGS. 9–10 illustrate the concept of distance for the set of eight three-bit binary numbers 000, 001, 010, 011, 100, 101, 110, and 111. FIG. 9 shows a table 900 of distances between all pairs of the three-bit code words. The eight three-bit binary numbers are located along top row 902 and along the left-most column 904. The distance d between any two three-bit numbers is given as entry in the table. For example, the distance between the three-bit number "000" 906 and the three-bit number "111" 908 is "3" and located at table entry 910. Note that the distance profile includes the distance of each codeword with itself. For example, the "0" entries in diagonal 912 corresponds to distance of each codeword with itself and is the minimum distance $d_{min}$. The maximum possible distance, $d_{max}$, between any of the two three-bit numbers is "3," which corresponds to the entries in diagonal 914.

FIG. 10 shows a distance profile 1000 for the set of three-bit numbers discussed with reference to FIG. 9. The distance profile 1000 is a plot of the number of unique number pairs at each possible distance, in histogram form. The columns of the histogram correspond to the number three-bit binary numbers having the same distance, which are determined by counting the number of entries in table 900 that have the same value. For example, column 1002 of the histogram represents the 24 different pairs of three-bit numbers that are separated from one another by a distance of "1," which is determined by counting all of the entries in table 900 with the value "1." Column 1004 corresponds to the eight number "0" entries in diagonal 912, and column 1006 corresponds to the eight number "3" entries in diagonal 914.

FIG. 11 illustrates determination of the weight of a code word. The weight of a code word is the sum of the bit values contained in the bit vector representing the code word. In other words, the weight of a code word is the number of "1" bits within the code word. The weight of a code word can be computed either by counting the number of "1" bits 1102 in the bit vector representation of the code word, or can be alternatively computed as the distance between the code word and the all-0-bit code word $u_0$ 1104. The weight of a code word may be specified in functional form as w(u), or alternatively as $w_u$.

Figure 12:
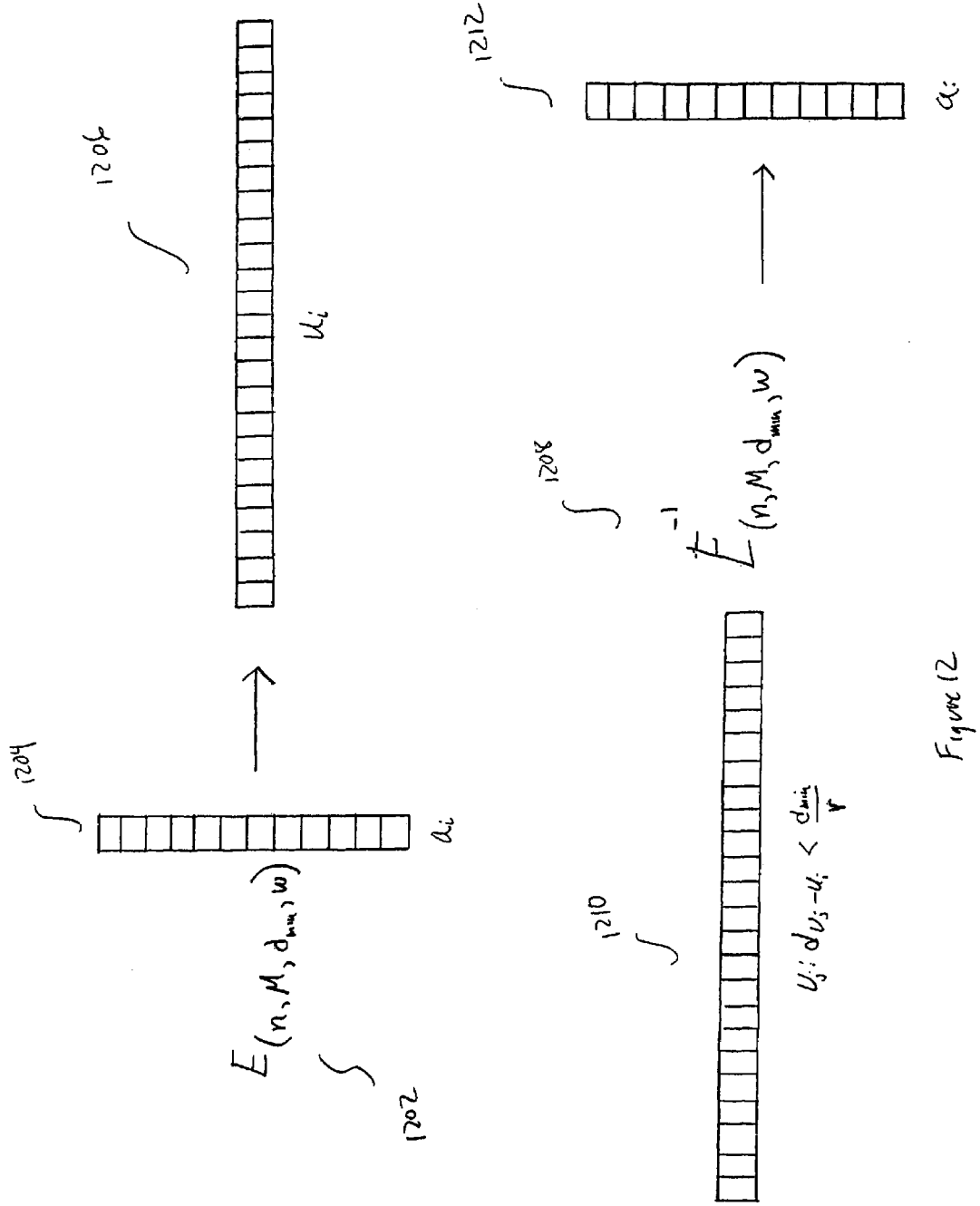
FIG. 12 illustrates a constant-weight code.

Having discussed the weight of a code word w(u), the minimum distance between two code words in a set of code words, $d_{min}$, the length of a code M, and the length of code words n, the notational convention used for specifying constant-weight codes can now be described. FIG. 12 illustrates a constant-weight code. A constant-weight code is specified as a four-integer tuple (n, M, $d_{min}$, w), where n is the length of the code words, M is the number of code words in the code, or size of the code, $d_{min}$ is the smallest distance between any two code words in the code, and w is the weight of each code word in the code. As the name implies, in a constant-weight code, all code words have an identical, fixed weight w. A constant-weight code can be thought of an operator E(n, M, $d_{min}$, w) 1202 that operates on an address vector $a_i$ 1204 to produce a code word $u_i$ 1206. A constant-weight code is also characterized by a reverse operator $E^{-1}$(n, M, $d_{min}$, w) 1208 that operates on an n-length bit vector 1210 to produce an address vector $a_i$ 1212. While the encryption operator E(n, M, $d_{min}$, w) produces a single, unique code word $u_i$ for each address $a_i$, the inverse operator $E^{-1}$(n, M, $d_{min}$, w) maps all code words within some distance of code word $u_i$ to the address $a_i$ corresponding to code word $u_i$. This many-to-one mapping of the reverse operator $E^{-1}$ is the basis for the error-correction aspect of constant-weight codes, and other error-correction codes. Text or numeric values that need to be transferred through a noisy channel are broken up into segments of length q, each segment is considered to be an address, the addresses are encoded by a constant-weight-code operator E as a sequence of code words, and the code words are transmitted. A small number of errors in a received code word, generally less that, $d_{min}/2$, can be tolerated by the reverse operator $E^{-1}$ that maps the code words back to the unencoded information.

EMBODIMENTS OF THE PRESENT INVENTION

Various embodiments of the present invention are directed to demultiplexers that include nonlinear tunneling resistor nanowire junctions and nanowire addressing methods for reliably addressing nanowires in demultiplexers. The embodiments employ constant-weight codes in microscale/nanoscale encoder-demultiplexers that can be used to address nanowires within nanowire crossbars, including the nanowires in memory elements in nanoscale memory arrays, nanowires in logic arrays, or latches of a latch array.

Figures 13, 14:
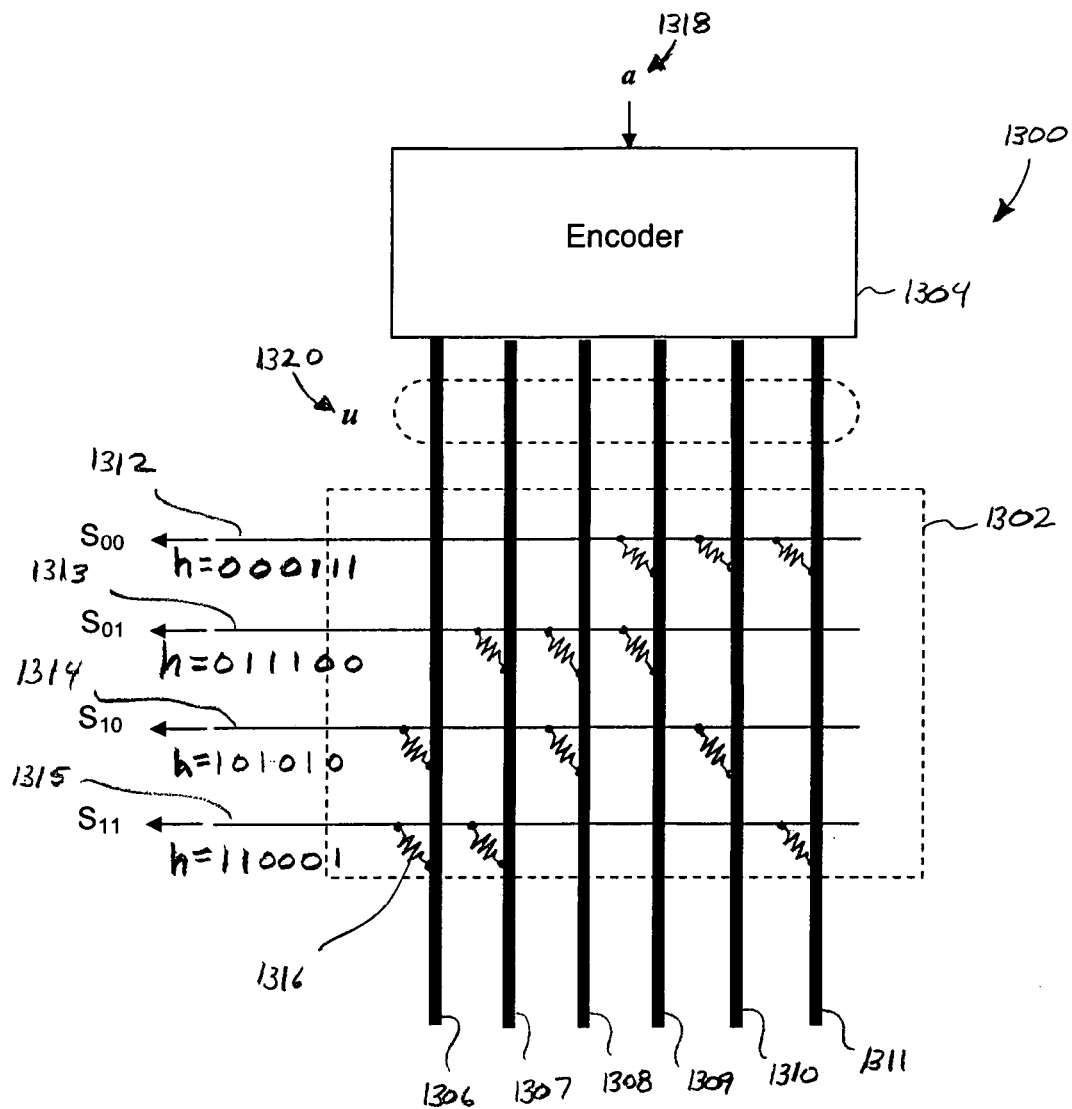
FIG. 13 illustrates a microscale/nanoscale encoder-demultiplexer that represents one of many embodiments of the present invention.
FIG. 14 shows a table of example binary input addresses input into an encoder of the microscale/nanoscale demultiplexer shown in FIG. 13 that represents one of many embodiments of the present invention.

FIG. 13 illustrates a microscale/nanoscale encoder-demultiplexer 1300 that represents one of many embodiments of the present invention. Demultiplexer 1300 includes a mixed microscale/nanoscale crossbar array 1302 and an encoder 1304. The crossbar array 1302 includes a set of microscale signal lines 1306–1311 that are selectively interconnected to a set of nanowires 1312–1315 via resistor junctions, such as resistor junction 1316. The microscale signal lines are also interconnected to the encoder 1304. The encoder 1304 encodes received addresses a according to a constant-weight code and outputs the code word u 1320 as a pattern of high and low voltages, or as a pattern of oppositely polarized voltages, on the microscale signal lines 1306–1311. The voltages applied to microscale signal lines 1306–1311 result in voltages output on the nanowires 1312–1315.

The pattern of voltages output from the encoder 1304 corresponding to a code word u results in a number of different voltages output from the nanowires 1312–1315. The nanowire with an address h that matches the code word u carries the highest voltage output and is called the "selected nanowire." The remaining nanowires are called "non-selected nanowires." The address of each nanowire corresponds to the pattern of resistor junctions interconnecting the nanowire to the microscale signal lines emanating from the encoder 1304. The address of a nanowire can be determined by starting from the left-most microscale signal wire, advancing to the right most microscale signal wire, and representing each microscale-signal-wire/nanowire intersection that includes a resistor by the binary value "1" and representing each junction that does not include a resistor by the binary value "0." For example, the address of the nanowire 1312 is determined by starting from the left most signal wire 1306 and advancing toward the right most signal wire 1311, which reveals the pattern of resistor junctions "0," "0," "0," "1," "1," and "1." As a result, the address h of the nanowire 1312 equals "000111." FIG. 14 shows a table of example binary input addresses a and binary output addresses u that represents one of many embodiments of the present invention. The binary input addresses a that are input into the encoder 1304 are displayed in column 1402, and column 1404 displays the corresponding binary code words u output from the encoder 1304. Each code word u in the column 1404 corresponds to an address h of one of the nanowires 1312–1315 shown in FIG. 13.

Figure 15A:
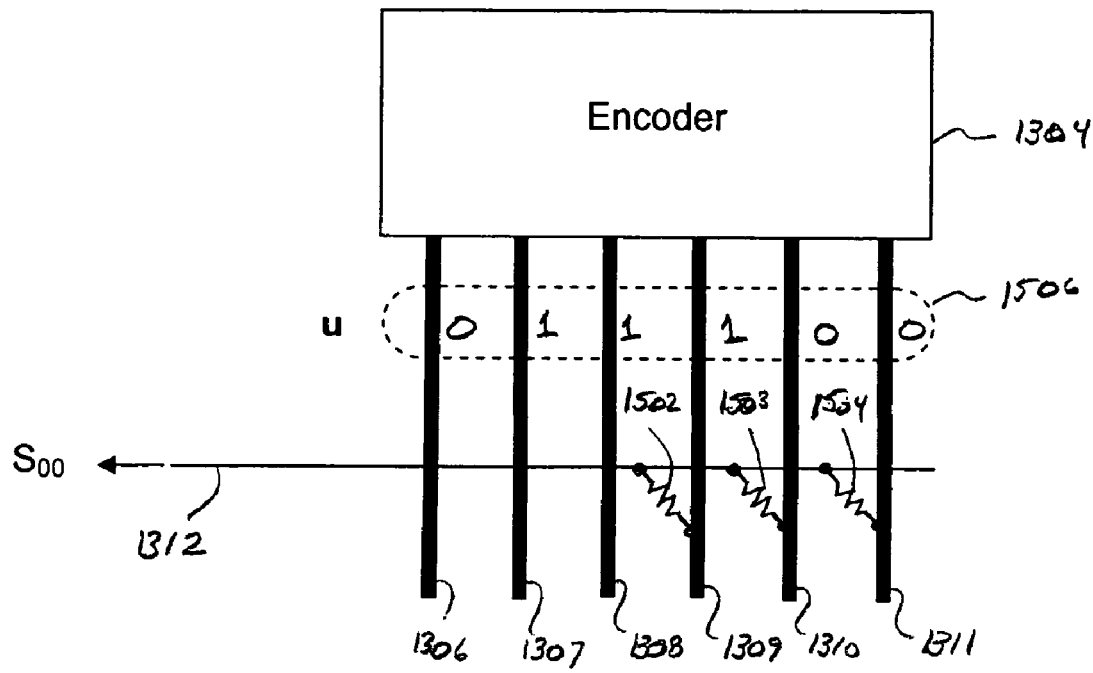
FIGS. 15A–15B illustrate a voltage-divider representation of a nanowire of a demultiplexer receiving voltages from an encoder.
Figure 15B:
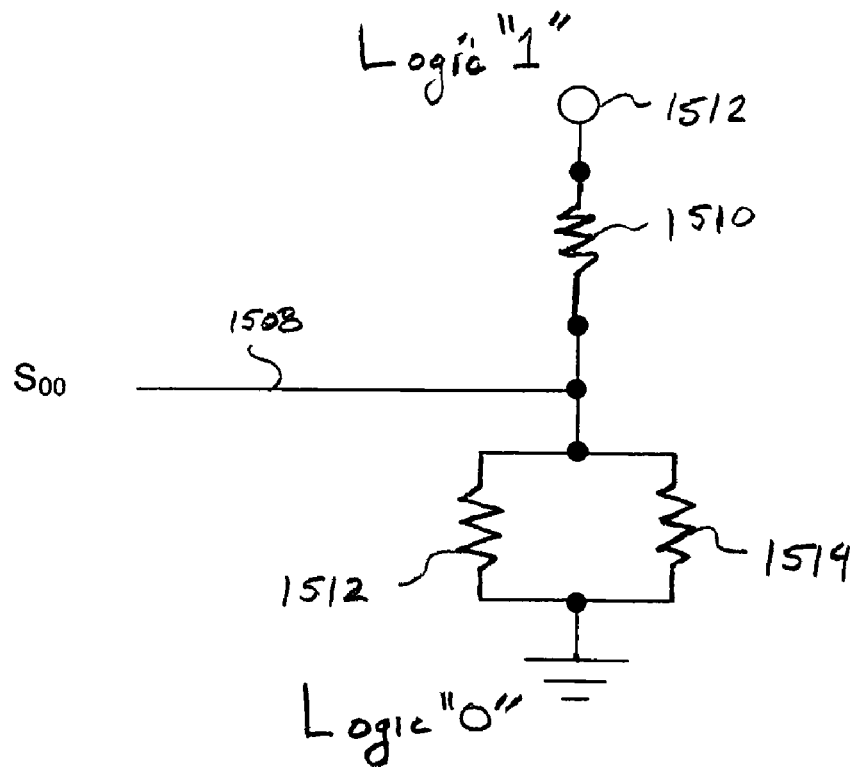

The voltage output from a nanowire receiving a pattern of voltages results from a voltage-divider effect, as described above with reference to FIGS. 6A–6B. FIGS. 15A–15B illustrate an example of a voltage-divider representation of a nanowire 1312 receiving voltages from the encoder 1304. FIG. 15A illustrates the nanowire 1312 of the demultiplexer 1300 interconnected to microscale signal lines 1309–1311 via resistor nanowire junctions 1502–1504. In FIG. 15A, a code word composed of a pattern of voltages output by the encoder 1304 to the microscale signal lines is represented by numeric binary values "0" and "1" within the dashed-line enclosure 1506. The voltage corresponding to binary value "1" can be considered to be a source voltage, and the voltage corresponding to the binary value "0" can be considered to be a ground or a voltage sink. For example, the binary value "1" can correspond to a voltage 2V, and the binary value "0" can correspond to ground or to a voltage sink at a relative voltage of −2 V. The microscale signal lines carrying a voltage corresponding to the binary value "1" are interconnected to the nanowire 1312 and can be considered as a set of parallel resistors that interconnect the nanowire 1312 to a voltage source. The microscale signal lines carrying a voltage corresponding to the binary value "0" are interconnected to the nanowire 1312 and can be considered as a set of parallel resistors that interconnect the nanowire 1312 to a ground or a voltage sink. FIG. 15B illustrates a schematic voltage-divider representation of the microscale/nanoscale demultiplexer shown in FIG. 15A. In FIG. 15B, line 1508 represents nanowire 1312, upper resistor 1510 represents a combination of the microscale signal line 1310 and the resistor junction 1503 that carries a voltage corresponding to the binary value "1," lower resistors 1512 and 1514 represent the combination of the microscale signal line 1309 and the resistor junction 1502, and the combination of the microscale signal line 1311 and the resistor junction 1504, both of which represent voltages corresponding to the binary value "0." Open circle 1512 represents a voltage source. A schematic voltage-divider representation of a nanowire interconnected to a number of microscale signal lines can be used to determine the voltage output from the nanowire.

Figure 16A:
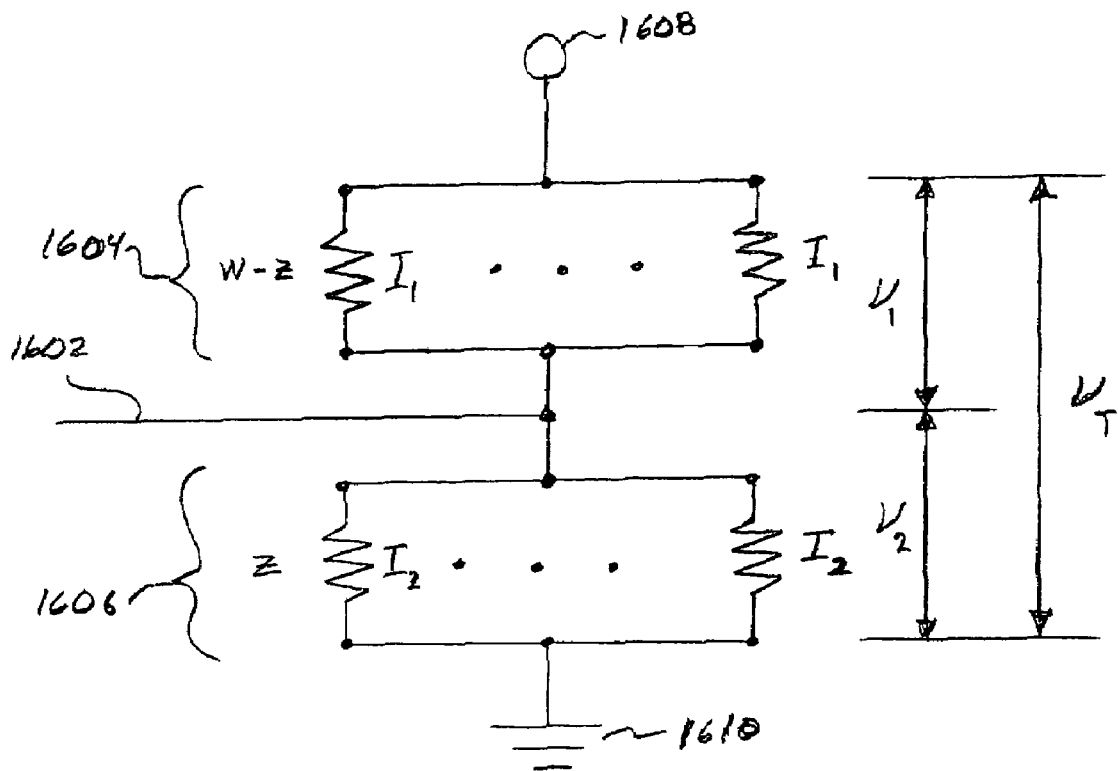
FIG. 16A shows a voltage-divider representation of a nanowire interconnected to a number of microscale signal lines of an encoder-demultiplexer that represents one of many embodiments of the present invention.
Figure 16B:
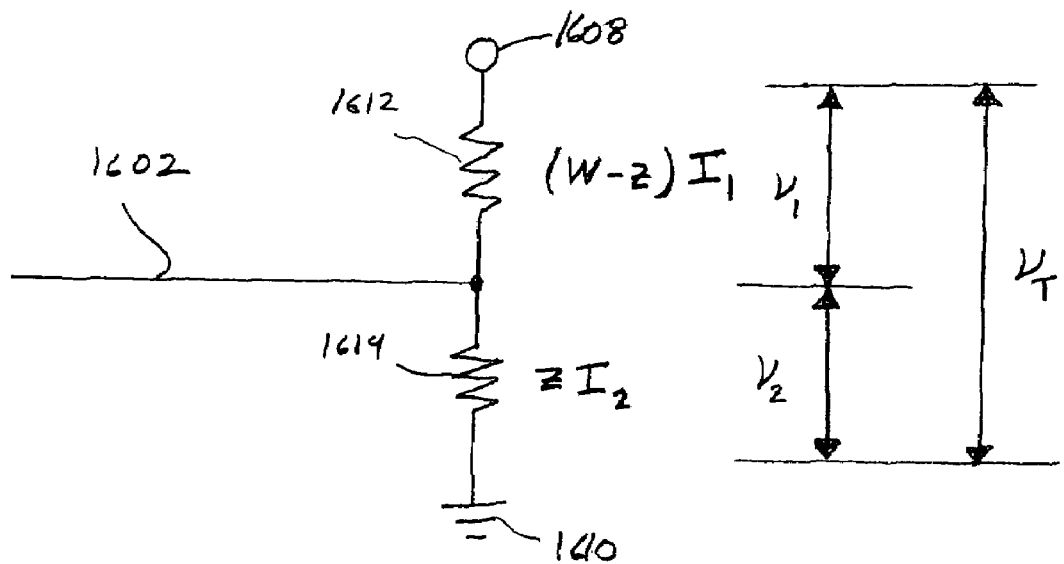
FIG. 16B shows single resistor representations of resistors bundles of the voltage-divider representation shown in FIG. 16A.

FIGS. 16A–16B show a voltage-divider representation of a nanowire interconnected to a number of microscale signal lines of a demultiplexer that is used to determine voltages output from a nanowire and represents one of many embodiments of the present invention. In FIG. 16A, line 1602 represents a demultiplexer nanowire. Each of the upper parallel resistors 1604 represents a resistor junction that interconnects the nanowire 1602 to a microscale signal line that carries a voltage corresponding to the binary value "1," each of the lower parallel resistors 1606 represents a resistor junction that interconnects the nanowire 1602 to a microscale signal line that carries a voltage corresponding to the binary value "0." The resistors in both sets of parallel resistors 1604 and 1606 are identical. The number of resistors in the upper set of parallel resistors 1604 can be determined by the difference:

$$w-z$$

where w is the weight of the code word u, $z=d(h,u)/2$ is the number of resistors in the lower set of parallel resistors 1606, and d (h,u) is the distance between h and u.

The total current flowing through the upper set of parallel resistors 1604 is $(w-z)I_1$, where $I_1$ is the current flowing through each of the resistors in the upper resistor bundle 1604. The total current flowing through the lower set of parallel resistors 1606 is $zI_2$, where $I_2$ is the current flowing through each of the resistors in the lower set of parallel resistors 1604. As a result, the upper set of parallel resistors 1604 can be represented by a single resistor, and the lower set of parallel resistors 1606 can be represented by a single resistor. FIG. 16B shows single-resistor representations 1612 and 1614 of the upper set of parallel resistors 1604 and the lower set of parallel resistors 1606, respectively. The total voltage, $v_T$, between voltage source 1608 and ground 1610 equals the sum of voltages across both sets of parallel resistors 1604 and 1606 and is given by:

$$v_T = v_1 + v_2$$

where $v_1$ is the voltage across the upper set of parallel resistors 1604, and $v_2$ is the voltage across the lower set of parallel resistors 1606.

Because the upper and lower set of parallel resistors 1604 and 1606 can be thought of as corresponding to single resistors 1612 and 1614 in a series, as shown in FIG. 16B, the current flowing through the upper set of parallel resistors 1604 equals the current flowing through the lower set of parallel resistors 1606 and is represented by the following current equation:

$$(w-z)I_1 = zI_2$$

which can be used to determine the voltage output from the nanowire 1602. Substituting the tunneling resistor current-versus-voltage relationships:

$$I_1 = k\, sinh(av_1), \text{ and}$$

$$I_2 = k\, sinh(av_2)$$

into the current equation above gives:

$$(w-z)k\, sinh(a(v_T-v_2)) = zk\, sinh(av_2)$$

where $$v_1 = v_T - v_2$$

Solving for the voltage $v_2$ gives the voltage output from the nanowire 1602:

$$v_{h,a}^{nonlinear} = \frac{1}{a}\tanh^{-1}\left(\frac{sinh(av_T)}{\frac{d}{2w-d} + cosh(av_T)}\right)$$

The demultiplexer nanowire output voltage $V_{h,a}^{nonlinear}$ is independent of the parameter k.

Figure 17A:
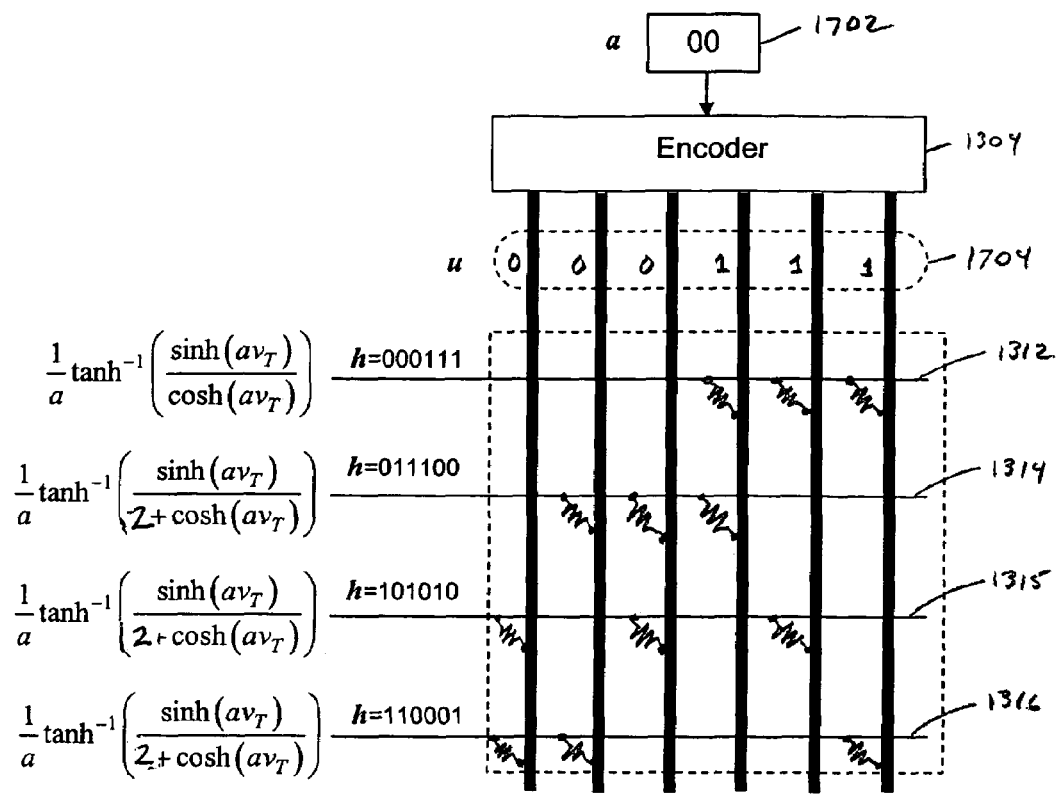
FIGS. 17A–17D show voltage outputs from nanowires of a demultiplexer employing tunneling resistor junctions that represents one of many embodiments of the present invention.
Figure 17B:
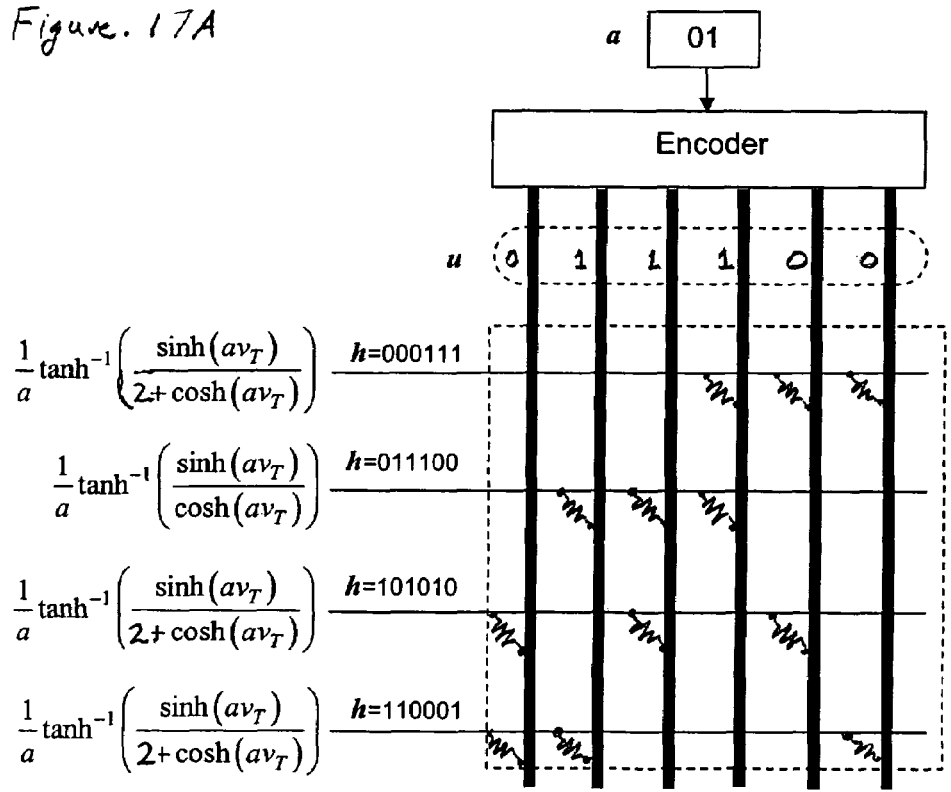
Figure 17C:
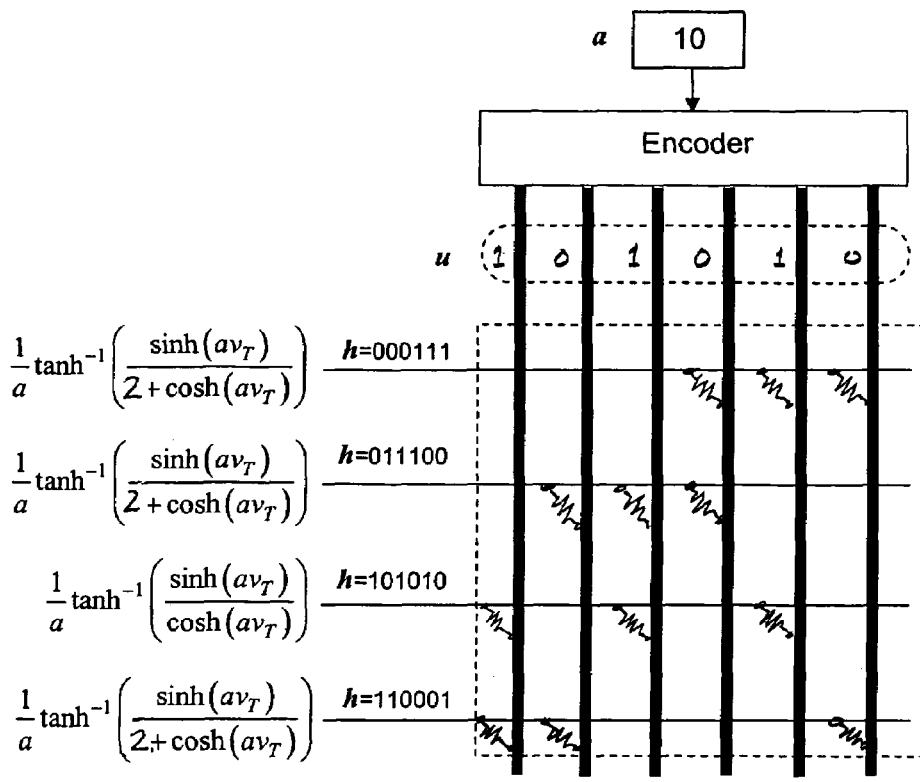
Figure 17D:
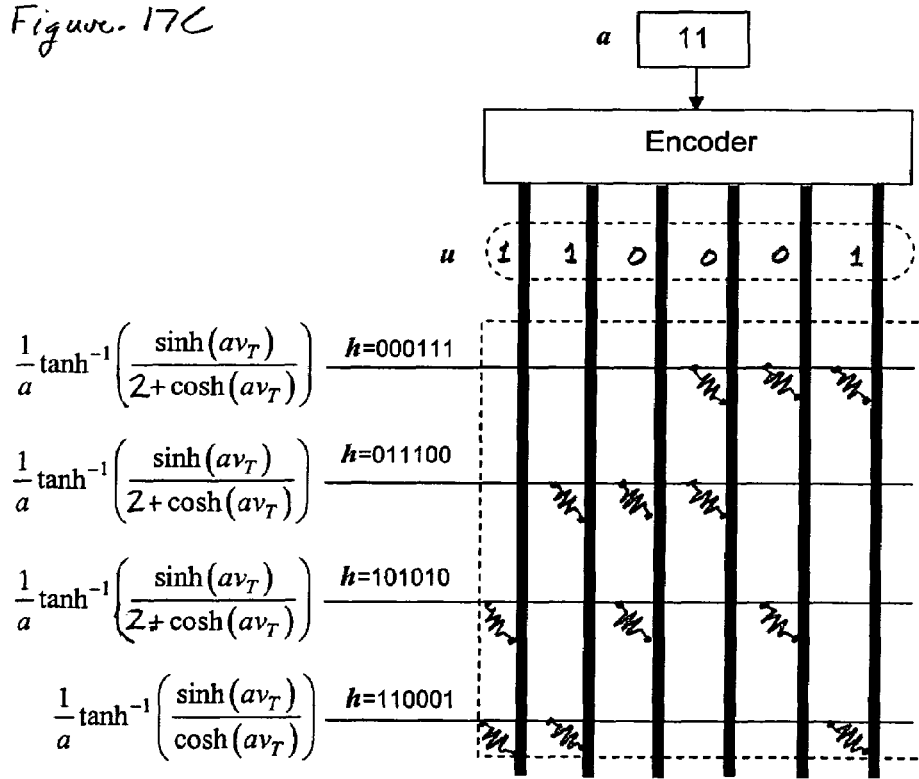

FIGS. 17A–17D show voltage outputs from nanowires of a demultiplexer employing tunneling resistor junctions that represents one of many embodiments of the present invention. In FIG. 17A, input address a "00" 1802 is input to the encoder 1304, which outputs the code word u "000111" 1704 that corresponds to the address h of the nanowire 1312. As a result, the selected nanowire 1312 outputs the voltage:

$$v_{h,a}^{nonlinear} = \frac{1}{a}\tanh^{-1}\left(\frac{sinh(av_T)}{cosh(av_T)}\right)$$

and the remaining non-selected nanowires 1313–1315 each output the voltage:

$$v_{h,a}^{nonlinear} = \frac{1}{a}\tanh^{-1}\left(\frac{sinh(av_T)}{2 + cosh(av_T)}\right)$$

which is less than the voltage output by the selected nanowire 1312. FIGS. 17B–17D illustrate operation of the demultiplexer shown in FIG. 17A for the input addresses "01," "10," and "11," respectively, as described with reference to FIG. 17A.

In FIGS. 17A–17D, the voltages output from the non-selected nanowires are identical, but demultiplexers employing a large number of nanowires and a large number of microscale signal lines may output a number of different voltages from non-selected nanowires that fall within a voltage range called the "OFF-voltage range," which is represented by the interval:

$$[v_{min}^{OFF}, v_{max}^{OFF}]$$

where $$v_{min}^{OFF}$$

represents the minimum voltage output from a set of non-selected nanowire, and $$v_{max}^{OFF}$$

represents the maximum voltage output from a set of non-selected nanowire.

Certain constant-weight codes perform better with tunneling-resistor-junction-based demultiplexers than with linear-resistor-junction-based demultiplexers, and other constant-weight codes perform better with linear-resistor-junction-based demultiplexers than with tunneling-resistor-junction-based demultiplexers. Whether a constant-weight code performs better with a tunneling-resistor-junction-based demultiplexer or a linear-resistor-junction-based demultiplexer can be assessed by comparing the size of the OFF-voltage range and the voltage difference, $$v^{ON} - v_{\max}^{OFF},$$

where $v^{ON}$ represents the voltage output from a selected nanowire. For example, a first demultiplexer with a narrower OFF-voltage range and larger voltage difference, $$v^{ON} - v_{\max}^{OFF},$$

than a second demultiplexer performs better than the second demultiplexer because the voltages $$v^{ON} \text{ and } v_{\max}^{OFF}$$

can be more easily distinguished during operation of the first demultiplexer. Performance of a constant-weight code can be qualitatively assessed by computing a splay:

$$s = \frac{v_{\max}^{OFF} - v_{\min}^{OFF}}{v^{ON} - v_{\min}^{OFF}}$$

or a voltage margin:

$$\Delta v = 1 - s = \frac{v^{ON} - v_{\max}^{OFF}}{v^{ON} - v_{\min}^{OFF}}$$

A first demultiplexer with a large voltage margin (small splay) corresponds to a narrower OFF-voltage range and larger voltage difference, $$v^{ON} - v_{\max}^{OFF},$$

than a second demultiplexer with a smaller voltage margin (large splay).

The descriptions associated with FIGS. 18–19 below provide qualitative example comparisons of how two different constant-weight codes perform with a linear-resistor-junction-based demultiplexer and a tunneling-resistor-junction-based demultiplexer. In the discussion following FIGS. 18–19, applications of the splay and the voltage margin are provided as examples of quantitative assessment of how the two different constant-weight codes perform with a linear-resistor-junction-based demultiplexer and a tunneling-resistor-junction-based demultiplexer.

First, the voltage output from a nanowire of a linear-resistor-junction-based demultiplexer is determined as follows. A demultiplexer employing linear resistor junctions has a linear current-versus-voltage relationship:

$$I = \frac{v}{R}$$

Substituting the linear current-versus-voltage relationships $I_1 = v_1/R$ and $I_2 = v_2/R$ into the current equation above gives:

$$(w-z)v_1 = z v_2$$

Solving for $v_2$ gives the voltage output from a nanowire of demultiplexer that employs linear resistor junctions:

$$v_{h,a}^{linear} = \left(1 - \frac{z}{w}\right) v_T$$

Figure 18:
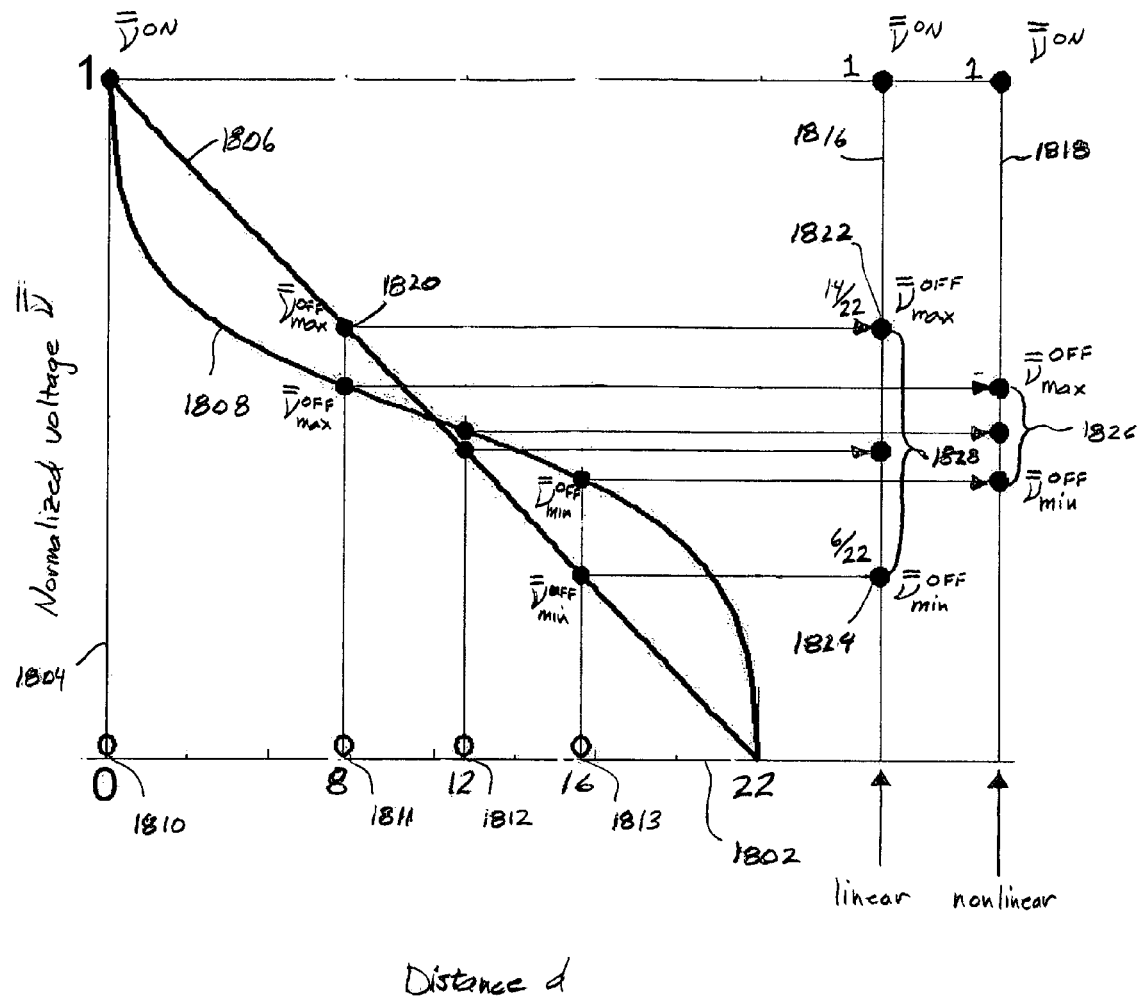
FIG. 18 shows a pair of example, normalized, nanowire output voltage-versus-distance plots for a linear-resistor-junction-based demultiplexer and a tunneling-resistor-junction-based demultiplexer, both using constant-weight code (22,64,8,11) and each representing one of many embodiments of the present invention.

FIG. 18 shows a pair of example normalized nanowire output voltage-versus-distance plots for a linear-resistor-junction-based demultiplexer and a tunneling-resistor-junction-based demultiplexer, both using an identical constant-weight code (22,64,8,11) and each representing one of many embodiments of the present invention. In FIG. 18, horizontal axis 1802 is the distance d(h,u), and vertical axis 1804 is the normalized voltage. The normalized voltage output from a nanowire of linear-resistor-junction-based demultiplexer is:

$$\overline{v} = \frac{v_{h,a}^{linear}}{v_T}$$

and the normalized voltage output from a nanowire of tunneling-resistor-junction-based demultiplexer is:

$$\overline{v} = \frac{v_{h,a}^{nonlinear}}{v_T}$$

Curve 1806 represents the normalized voltages for a linear-resistor-junction-based demultiplexer, and non-linear curve 1808 is the normalized voltage for a tunneling-resistor-junction-based demultiplexer, where the scale factor a in the current-voltage equation $$v_{h,a}^{nonlinear}$$

equals 5.54. There are four possible distances "0," "8," "12," and "16" between the addresses h of the 64 nanowires and code words u output by an encoder, which are identified by the points 1810–1813, respectively. The distance "0" 1810 corresponds to the selected nanowire with normalized voltage $$\overline{v}^{ON}.$$

The distances 1811–1813 correspond to the remaining 63 non-selected nanowires. The distances 1811 and 1813 correspond to the normalized voltages $$\overline{v}_{\max}^{OFF} \text{ and } \overline{v}_{\min}^{OFF},$$

respectively, for both the linear curve 1806 and the nonlinear curve 1808. The voltages on the linear curve 1806 are projected onto a linear voltage axis 1816, and the voltages on the nonlinear curve 1808 are projected onto the nonlinear voltage axis 1818, as indicated by directional arrows. Normalized voltage values are located to the left of the voltages $$\overline{v}_{\max}^{OFF} \text{ and } \overline{v}_{\min}^{OFF},$$

on the linear voltage axes 1816 and the nonlinear voltage axis 1818. For example, the points 1822 and 1824 correspond to the normalized voltages 14/22 and 6/22, respectively. The normalized voltages plotted on the voltage axes 1816 and 1818 show that the voltage difference, $$\overline{v}^{ON}.$$

is smaller for the tunneling-resistor-junction-based demultiplexer than for the linear-resistor-junction-based demultiplexer. In addition, the voltage range 1826 associated with the tunneling-resistor-junction-based demultiplexer is smaller than the voltage range 1828 associated with the linear-resistor-junction-based demultiplexer. As a result, the constant-weight code (22, 64, 8, 11) performs better with the tunneling-resistor-junction-based demultiplexer than with the linear-resistor-junction-based demultiplexer.

Figure 19:
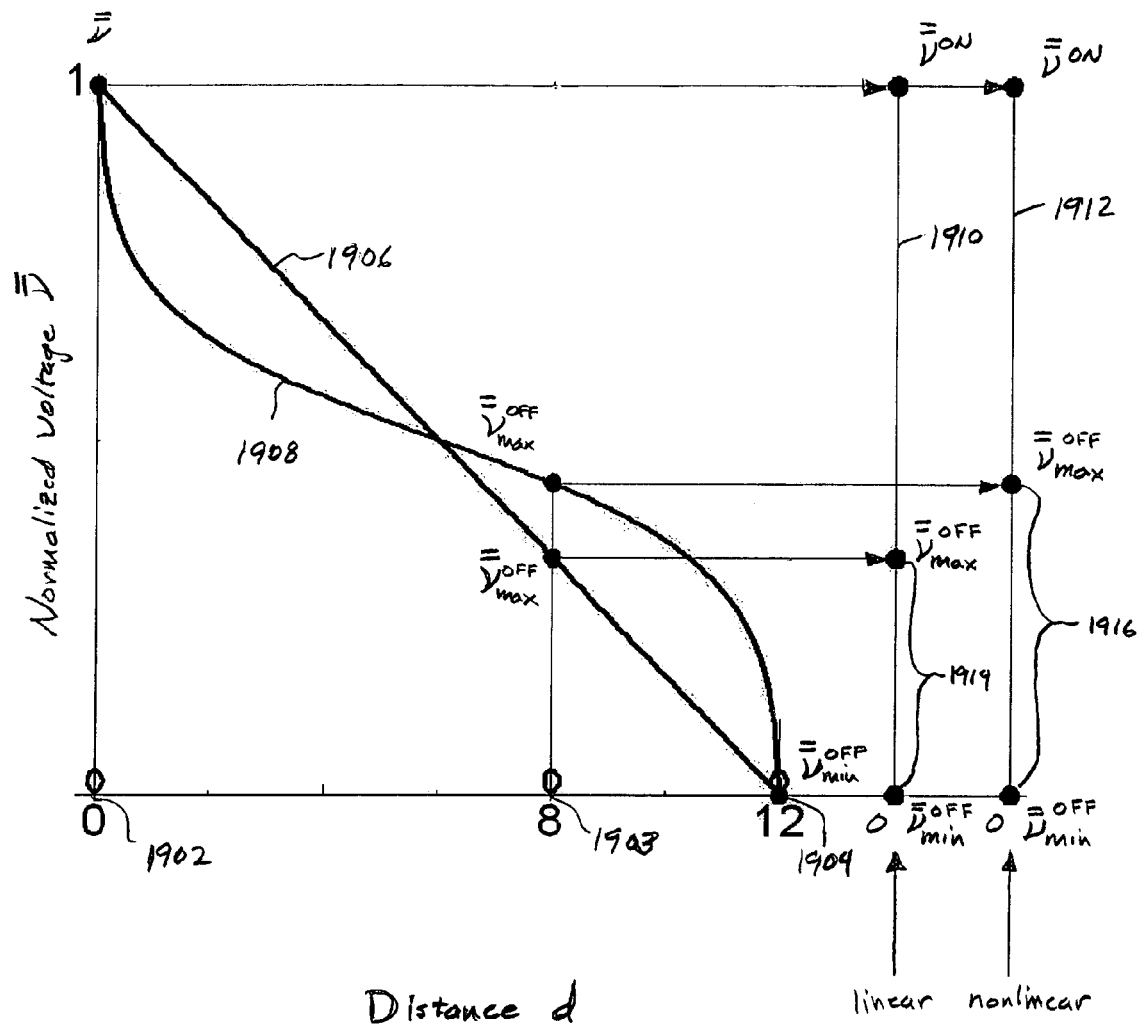
FIG. 19 shows a pair of example, normalized, nanowire output voltage-versus-distance plots for a linear-resistor-junction-based demultiplexer and a tunneling-resistor-junction-based demultiplexer, both using constant-weight code (22,64,8,6) and each representing one of many embodiments of the present invention.

FIG. 19 shows a pair of example normalized nanowire output voltage-versus-distance plots for a linear-resistor-junction-based demultiplexer and a tunneling-resistor-junction-based demultiplexer, both using constant-weight code (22,64,8,6) and each representing one of many embodiments of the present invention. The three possible distances "0," "8," and "12" between the addresses h of the 64 nanowires and the code words u output by an encoder are identified by points 1902–1904. The distance "0" 1902 corresponds to selected nanowires, and the distances "8" 1903 and "12" 1904 correspond to non-selected nanowires. Curve 1906 represents the normalized voltages for a linear-resistor-junction-based demultiplexer, and curve 1908 represents the normalized voltages for a tunneling-resistor-junction-based demultiplexer. The distances 1903 and 1904 correspond to voltages $$\overline{v}_{\max}^{OFF} \text{ and } \overline{v}_{\min}^{OFF}$$

on the linear curve 1906 and nonlinear curve 1908. The linear curve 1906 voltages $$\overline{v}_{\max}^{OFF} \text{ and } \overline{v}_{\min}^{OFF}$$

are projected onto a linear voltage axis 1910, and the nonlinear curve 1908 voltages $$\overline{v}_{\max}^{OFF} \text{ and } \overline{v}_{\min}^{OFF}$$

are projected onto a nonlinear voltage axis 1912. The normalized voltages plotted on the voltage axes 1910 and 1912 show that the voltage difference, $$v^{ON} - v_{\max}^{OFF},$$

is larger for the linear-resistor-junction-based demultiplexer than for the tunneling-resistor-junction based demultiplexer, and that the OFF voltage range 1914 associated with the linear-resistor-junction-based demultiplexer is smaller than the OFF-voltage range 1916 associated with the tunneling-resistor-junction based demultiplexer. As a result, the constant weight code (22, 64, 8, 6) performs better with the linear-resistor-junction-based demultiplexer than with the tunneling-resistor-junction-based demultiplexer.

Table 1 shows the splay s and the voltage margin Δv values determined for the constant weight codes described above with reference to FIGS. 18–19:

TABLE 1

|  | (22,64,8,11) | | (22,64,8,6) | |
| --- | --- | --- | --- | --- |
|  | s | Δv | s | Δv |
| Linear | ½ | ½ | ⅓ | ⅔ |
| Nonlinear | 0.234 | 0.766 | 0.438 | 0.562 |

Either the splay s or the voltage margin Δv values can be used to assess the performance of the constant-weight codes (22,64,8,11) and (22,64,8,6). The voltage margin Δv values of ½ and ⅔ show that the linear-resistor-junction-based demultiplexer performs better with the constant-weight code (22,64,8,6) than with the constant-weight code (22,64,8,11). The voltage margin Δv values of 0.766 and 0.562 show that the tunneling-resistor-junction-based demultiplexer performs better with the constant-weight code (22,64,8,11) than with the constant-weight code (22,64,8,6). The splay s or voltage margin Δv values shown in Table 1 can also be used to quantitatively compare the different constant-weight codes. The largest voltage margin Δv value of 0.766 indicates that the best overall performance is provided by the demultiplexer using tunneling resistor junctions in combination with the constant-weight code (22,64,8,11).

The equation representing $$v_{h,a}^{nonlinear}$$

above indicated that the voltages output from nanowires of a tunneling-resistor-junction-based demultiplexer depends on both the scale factor a and the total voltage level $v_T$ applied to the tunneling resistor junctions. Increasing the voltage $v_T$ and the scale factor a may improve the performance of tunneling-resistor-junction-based demultiplexers. Consider substituting the following equation:

$$av_T = \frac{v_T \ln 2}{V_u} = \overline{v}_T \ln 2$$

into the equation above to obtain the normalized representation of the voltages output by nanowires of a tunneling-resistor-junction-based demultiplexers:

$$\bar{v}_{h,a}^{nonlinear} = \frac{1}{\bar{v}_T \ln 2} \tanh^{-1}\left(\frac{\sinh(\bar{v}_T \ln 2)}{(\bar{d}^{-1} - 1)^{-1} + \cosh(\bar{v}_T \ln 2)}\right)$$

where $\bar{d}$ is the normalized distance, and $\bar{v}_T$ is the voltage swing and is normalized to the unit voltage step $V_u$.

The voltage $\bar{v}_T$ is a product of both the scale factor a and the total voltage $v_T$.

Figure 20:
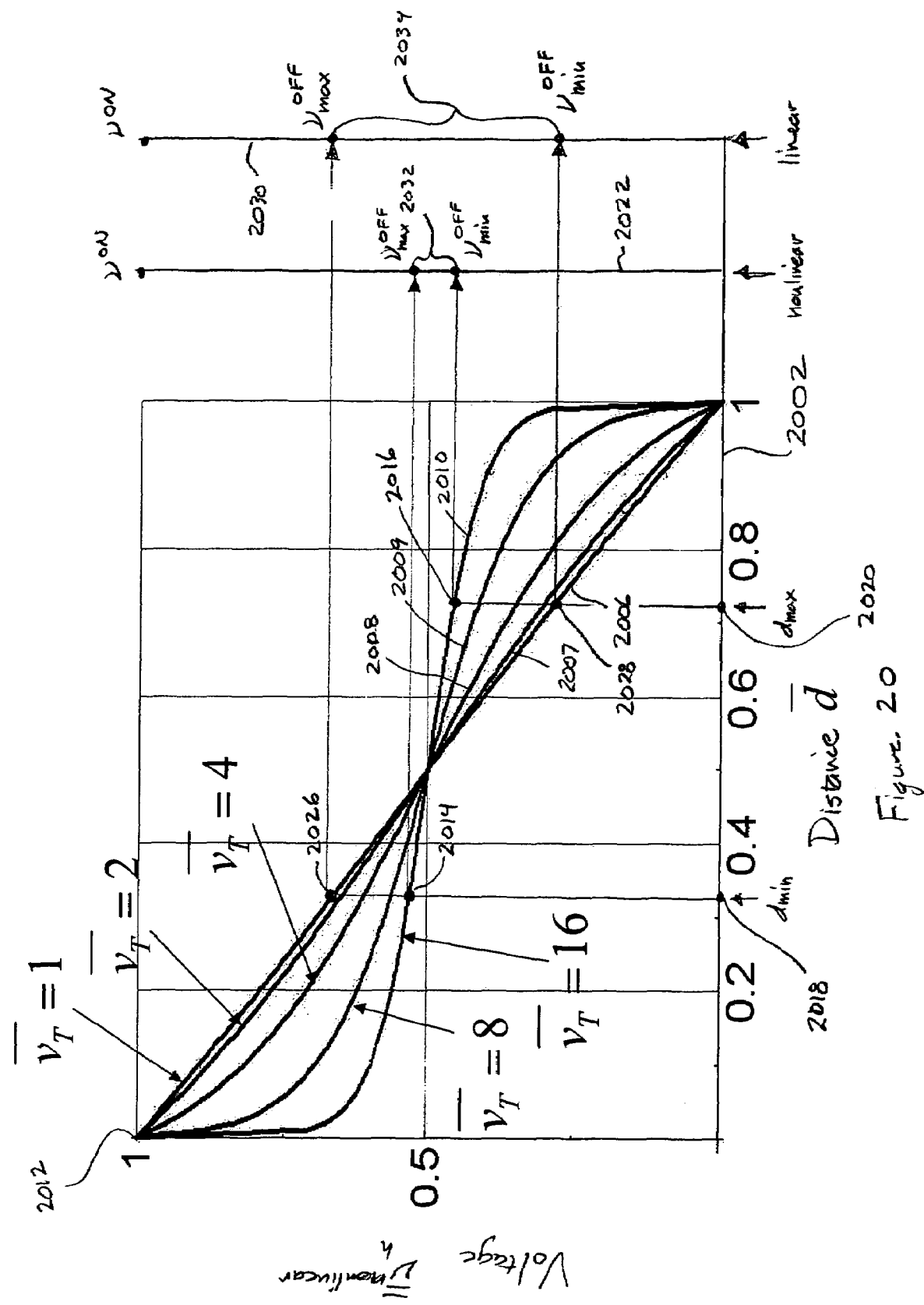
FIG. 20 shows five curves representing normalized nanowire output voltages versus normalized distance, each curve corresponding to a different normalized swing voltage.

FIG. 20 shows five normalized nanowire output voltage $\bar{v}_{h,a}^{nonlinear}$ versus normalized distances $\bar{d}$ curves, each corresponding to a different $\bar{v}_T$ that represent embodiments of the present invention. In FIG. 20, horizontal axis 2002 is normalized distance $\bar{d}$, and vertical line 2004 is normalized voltage $\bar{v}_{h,a}^{nonlinear}$.

Curves 2006–2010 represent normalized voltages $\bar{v}_{h,a}^{nonlinear}$ for $\bar{v}_T$ equal to "1," "2," "4," "8," and "16," respectively. The curves 2006–2010 are symmetric about the distance 0.5 and show that by increasing $\bar{v}_T$ the degree of nonlinearity increases. In addition, as the voltage $\bar{v}_T$ increases, the dependence on the normalized distance $\bar{d}$ decreases. For example, the curve 2006 closely approximates a line with slope −1. By contrast, the curve 2010 has a flat linear region and two steeply sloped regions near $\bar{d}$ equal to "0" and "1." The contrasting slopes of the curves 2006 and 2010 indicate that the nanowire output voltage $\bar{v}_{h,a}^{nonlinear}$ characterised by the curve 2006 has a larger compression/expansion than the nanowire output voltage $\bar{v}_{h,a}^{nonlinear}$ characterized by the curve 2010. The degree of nonlinearity of the curves 2006–2010 influences the size of the OFF voltage range $$[v_{min}^{OFF}, v_{max}^{OFF}]$$

and the voltage difference $$v^{ON} - v_{max}^{OFF}.$$

For example, the point 2012 corresponds to the ON voltage $v^{ON}$. The OFF voltages $v_{max}^{OFF}$ 2014 and $v_{min}^{OFF}$ 2016 of the curve 2010 correspond to the normalized distances $d_{min}$ 2018 and $d_{max}$ 2020, respectively, and are projected onto voltage axis 2022 to give OFF-voltage range 2032. The OFF voltages $v_{max}^{OFF}$ 2026 and $v_{min}^{OFF}$ 2028 on the curve 2006 also correspond to the normalized distances $d_{min}$ 2018 and $d_{max}$ 2020, respectively, and are projected onto voltage axis 2030 to give OFF-voltage range 2034. The OFF-voltage range 2032 is narrower than the voltage range 2034, and the voltage difference $$v^{ON} - v_{max}^{OFF}$$

is larger for the curve 2010 than for the curve 2006. As a result, curves 2006–2010 indicate that by increasing $\bar{v}_T$, the performance of tunneling-resistor-junction-based demultiplexers improves.

Although the present invention has been described in terms of particular embodiments, it is not intended that the invention be limited to these embodiments. Modifications within the spirit of the invention will be apparent to those skilled in the art. For example, in an alternate embodiment of the present invention, the properties of constant-weight codes identified as being favorable for the described embodiments may also be useful in pure microscale devices, and other devices. Although, in the described embodiments, each addressed nanowire has a unique internal address corresponding to a code word of a constant-weight code, in alternative embodiments of the present invention, two or more nanowires may have the same constant-weight-code address, and may be simultaneously selected. Although the described embodiments all use voltage signals, current signals and other types of signals may be employed in alternative embodiments. While the distinguished signals output to selected nanowires are higher-voltage signals than the signals output to non-selected nanowires, in alternative embodiments of the present invention, the distinguished signals may have a smaller magnitude or opposite voltage polarity than those output to non-selected nanowires.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. An encoder-demultiplexer comprising:
   q input signal lines;
   an encoder that generates an n-bit-constant-weight-code-code word internal address for each different input address received on the q input signal lines;
   n microscale signal lines on which an n-bit-constant-weight-code-code word internal address is output by the encoder, each microscale signal line carries one bit of the n-bit-constant-weight-code code-word internal address; and
   a number of encoder-demultiplexer-addressed signal lines interconnected with the n microscale signal lines via tunneling resistor junctions, the encoder-demultiplexer-addressed signal lines each associated with an n-bit-constant-weight-code-code word internal address.

2. The encoder-demultiplexer of claim 1 wherein the n microscale signal lines are selectively interconnected with the encoder-demultiplexer-addressed signal lines so that, when the encoder outputs a particular n-bit-constant-weight-code-code word internal address to the n microscale signal lines, a signal is input to an encoder-demultiplexer-addressed signal line associated with the n-bit-constant-weight-code-code word internal address that is distinguishable from signals input to all encoder-demultiplexer-addressed signal lines not associated with the n-bit-constant-weight-code-code word internal address.

3. The encoder-demultiplexer of claim 1 wherein the signal input to the encoder-demultiplexer-addressed signal line associated with the n-bit-constant-weight-code-code word internal address that is distinguishable from signals input to all encoder-demultiplexer-addressed signal lines not associated with the n-bit-constant-weight-code-code word internal address is a voltage signal of greater magnitude than voltage signals output to all encoder-demultiplexer-addressed signal lines not associated with the n-bit-constant-weight-code-code word internal address.

4. The encoder-demultiplexer of claim 1 wherein the signal input to the addressed signal line associated with the n-bit-constant-weight-code-code word internal address that is distinguishable from signals input to all addressed signal lines not associated with the n-bit-constant-weight-code-code word internal address is a voltage signal of smaller magnitude than voltage signals output to all addressed signal lines not associated with the n-bit-constant-weight-code-code word internal address.

5. The encoder-demultiplexer of claim 1 wherein the signal input to the addressed signal line associated with the n-bit-constant-weight-code-code word internal address that is distinguishable from signals input to all encoder-demultiplexer-addressed signal lines not associated with the n-bit-constant-weight-code-code word internal address is a current signal of greater magnitude than voltage signals output to all encoder-demultiplexer-addressed signal lines not associated with the n-bit-constant-weight-code-code word internal address.

6. The encoder-demultiplexer of claim 1 wherein the signal input to the encoder-demultiplexer-addressed signal line associated with the n-bit-constant-weight-code-code word internal address that is distinguishable from signals input to all encoder-demultiplexer-addressed signal lines not associated with the n-bit-constant-weight-code-code word internal address is a current signal of smaller magnitude than voltage signals output to all encoder-demultiplexer-addressed signal lines not associated with the n-bit-constant-weight-code-code word internal address.

7. The encoder-demultiplexer of claim 1 wherein the q input signal lines and the n microscale signal lines are microscale signal lines, the encoder is implemented in microscale or submicroscale logic, and the number of encoder-demultiplexer-addressed signal lines are nanowires.

8. The encoder-demultiplexer of claim 1 that, along with an additional encoder-demultiplexers, addresses nanoscale components of a nanoscale or mixed-scale device arranged in 3 or more logical dimensions.

9. The encoder-demultiplexer of claim 1 wherein the number of q signal-lines needed to address each encoder-demultiplexer-addressed signal line is given by:

$$q = \text{ceiling}(\log_2 M)$$

where M corresponds to the number of n-bit-constant-weight-code-code words.

10. A method for addressing signal lines in a mixed microscale/nanoscale demultiplexer, the method comprising:
    determining a number of signal lines that need to be addressed;
    determining a signal margin needed between a signal output to a selected, addressed signal line and any signal output to a non-selected, addressed signal; and
    implementing a tunneling-resistor-junction-based encoder-demultiplexer to address the number of signal lines.

11. The method of claim 10 wherein the signals are voltages.

12. The method of claim 10 wherein implementing a tunneling-resistor-junction-based encoder-demultiplexer to address the nanowires further comprises providing an encoder-demultiplexer having n microscale signal lines, on which an n-bit-constant-weight-code code-word internal address is output by a constant-weight-code-based encoder, interconnected with the signal lines, the signal lines each associated with an n-bit-constant-weight-code-code word internal address, and wherein the constant-weight-code-based encoder generates an n-bit-constant-weight-code-code word internal address for each different external address received on the signal lines.

* * * * *

UNITED STATES PATENT AND TRADEMARK OFFICE
CERTIFICATE OF CORRECTION

PATENT NO. : 7,319,416 B2  Page 1 of 1
APPLICATION NO. : 11/343325
DATED : January 15, 2008
INVENTOR(S) : Warren Robinett et al.

It is certified that error appears in the above-identified patent and that said Letters Patent is hereby corrected as shown below:

In column 23, line 22, delete " $\overline{\overline{v}}^{ON}$ " and insert -- 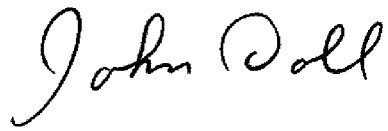 , --, therefor.

Signed and Sealed this

Fourteenth Day of July, 2009

JOHN DOLL
*Acting Director of the United States Patent and Trademark Office*